(12) United States Patent
Chen et al.

(10) Patent No.: US 9,336,892 B1
(45) Date of Patent: May 10, 2016

(54) REDUCING HOT ELECTRON INJECTION TYPE OF READ DISTURB IN 3D NON-VOLATILE MEMORY

(71) Applicant: SanDisk Technologies Inc., Plano, TX (US)

(72) Inventors: Hong-Yan Chen, Sunnyvale, CA (US); Yingda Dong, San Jose, CA (US); Charles Kwong, Redwood City, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/728,615

(22) Filed: Jun. 2, 2015

(51) Int. Cl.
*G11C 11/34* (2006.01)
*G11C 16/04* (2006.01)
*G11C 16/34* (2006.01)
*G11C 16/26* (2006.01)

(52) U.S. Cl.
CPC ............ *G11C 16/3427* (2013.01); *G11C 16/26* (2013.01); *G11C 16/3459* (2013.01)

(58) Field of Classification Search
CPC ........... G11C 16/0483; G11C 11/5628; G11C 16/10; G11C 11/5642; G11C 16/3418; G11C 16/3427; G11C 16/26; G11C 16/3454; G11C 16/3459; G11C 2211/5621; G11C 29/028; G11C 29/021; G11C 11/5635; G11C 16/16; G11C 16/12; G11C 16/349
See application file for complete search history.

(56) References Cited

U.S. PATENT DOCUMENTS

| 8,472,266 | B2 | 6/2013 | Khandelwal et al. | |
|---|---|---|---|---|
| 8,582,361 | B2 | 11/2013 | Maejima | |
| 8,670,285 | B2 | 3/2014 | Dong et al. | |
| 8,982,637 | B1 | 3/2015 | Dong et al. | |
| 9,165,659 | B1 * | 10/2015 | Pang | G11C 16/10 |
| 2014/0056065 | A1 | 2/2014 | Dong et al. | |
| 2014/0247663 | A1 | 9/2014 | Yuan et al. | |
| 2015/0221385 | A1 * | 8/2015 | Ahn | G11C 16/10 365/185.2 |
| 2015/0262714 | A1 * | 9/2015 | Tuers | G11C 29/50004 714/721 |

OTHER PUBLICATIONS

U.S. Appl. No. 14/601,531, filed Jan. 21, 2015, H. Chen et al., "Method of Reducing Hot Electron Injection Type of Read Disturb in Memory".
U.S. Appl. No. 14/669,247, filed Mar. 26, 2015, H. Chen et al., "Method of Reducing Hot Electron Injection Type of Read Disturb in Dummy Memory Cells".
U.S. Appl. No. 14/728,634, filed Jun. 2, 2015.

* cited by examiner

*Primary Examiner* — Hien Nguyen
(74) *Attorney, Agent, or Firm* — Vierra Magen Marcus LLP

(57) ABSTRACT

Read disturb due to hot electron injection is reduced in a 3D memory device by controlling the magnitude and timing of word line and select gate ramp down voltages at the end of a sensing operation. In an example read operation, the magnitude of a selected word line voltage is increased to be equal to pass voltages of unselected word lines, and the selected and unselected word line are ramped down at the same time, to avoid creating a channel gradient. In an example verify operation, the above procedure can be followed when the selected word line is at a source-side or middle range among all word lines. When the selected word line is at a drain-side among all word lines, a source-side select gate can be ramped down before the selected word line and a drain-side select gate can be ramped down after the selected word line.

21 Claims, 25 Drawing Sheets

Fig. 2

Code in storage device (150)

boot code (151)

control code / set of instructions (160)

instructions for applying a demarcation voltage to a selected word line (161);

instructions for determining whether a selected memory cell is in a conductive state (162);

instructions for increasing a voltage of the selected word line from the demarcation voltage to an elevated level (163);

instructions for concurrently ramping down the word line voltages (164);

instructions for ramping down a voltage of a selected source-side select gate line from a respective turn-on voltage, Vsgs_sel_on, to a respective turn-off voltage (165);

instructions for ramping down a voltage of a selected drain-side select gate line from a respective turn-on voltage, Vsgd_sel_on, to a respective turn-off voltage, Vsgd_sel_off (166).

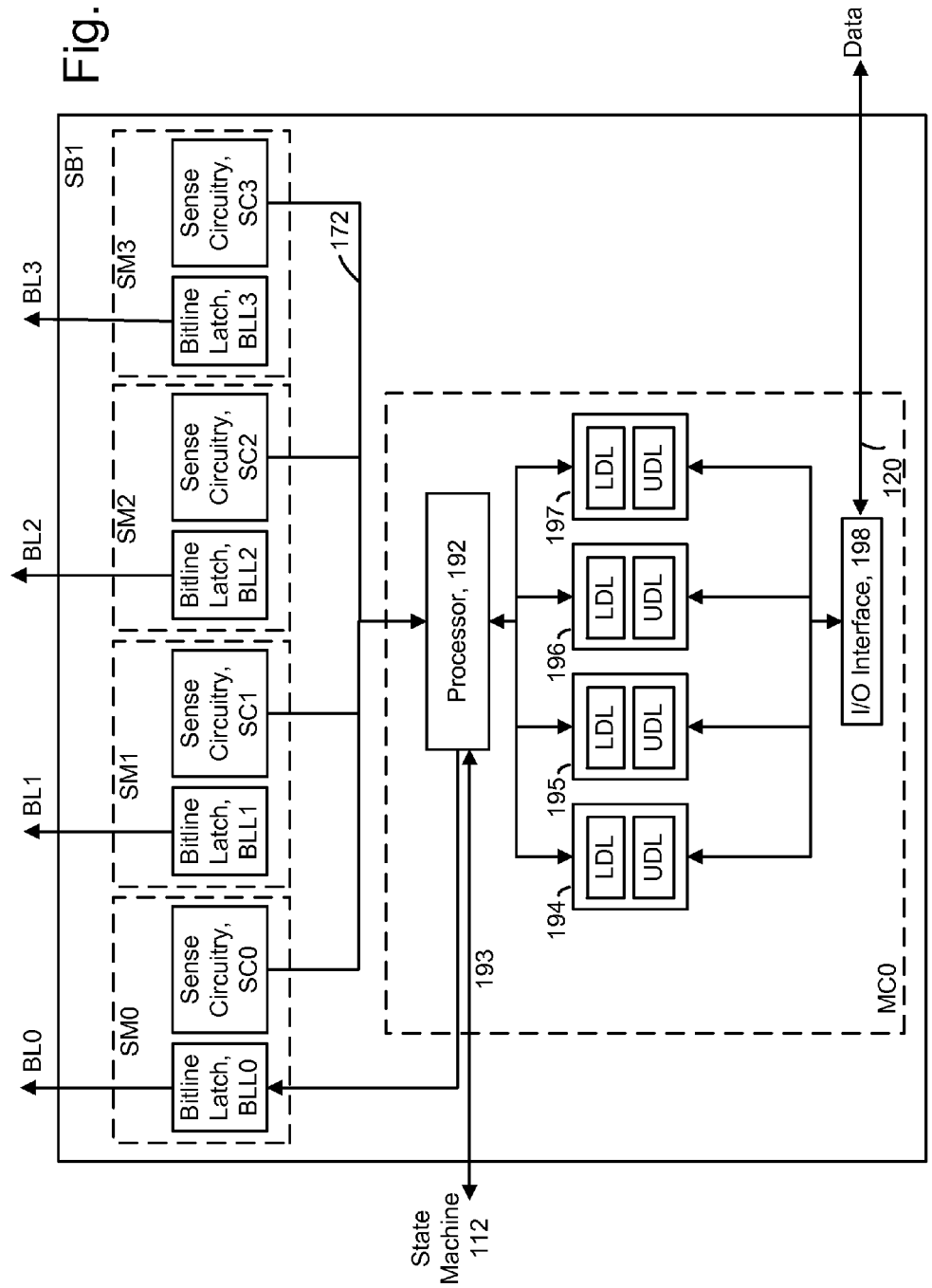

Fig. 4D
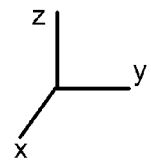
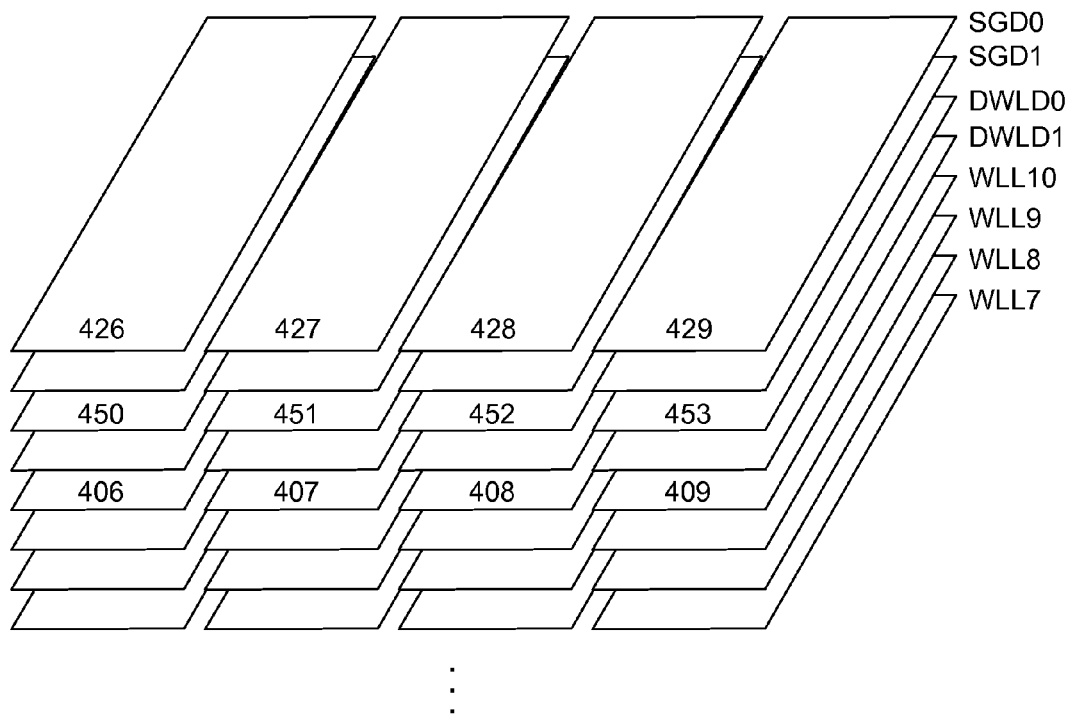
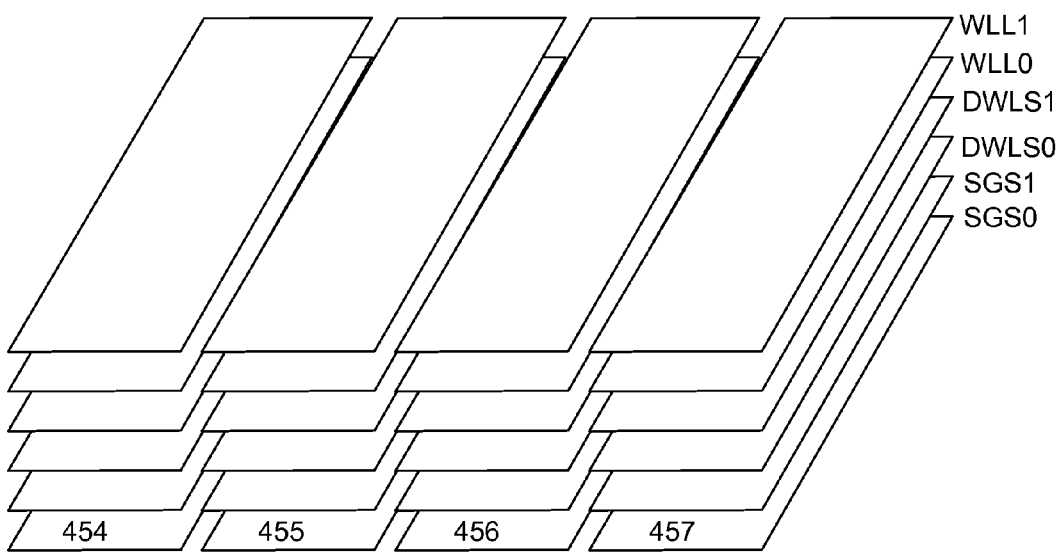

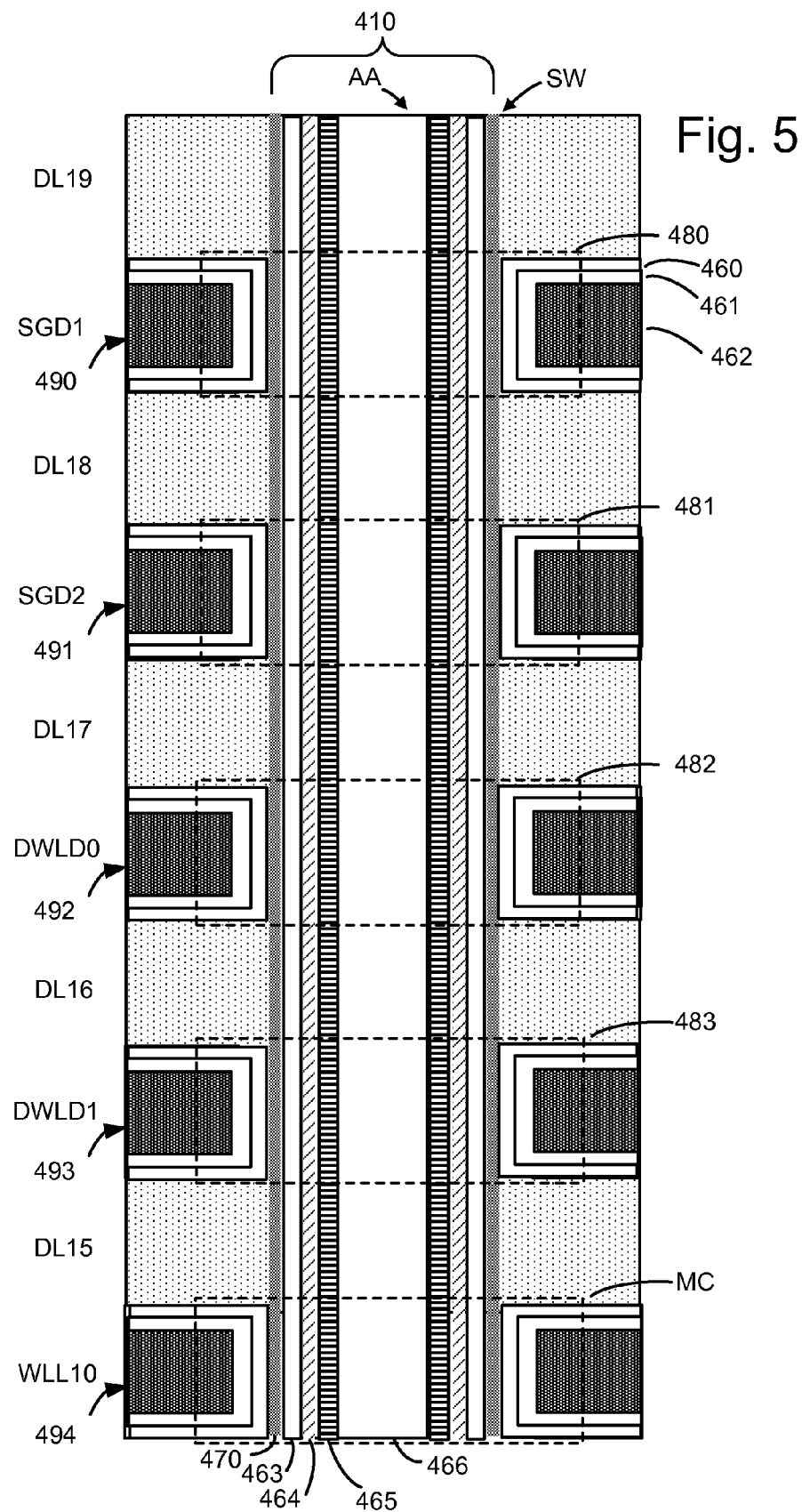

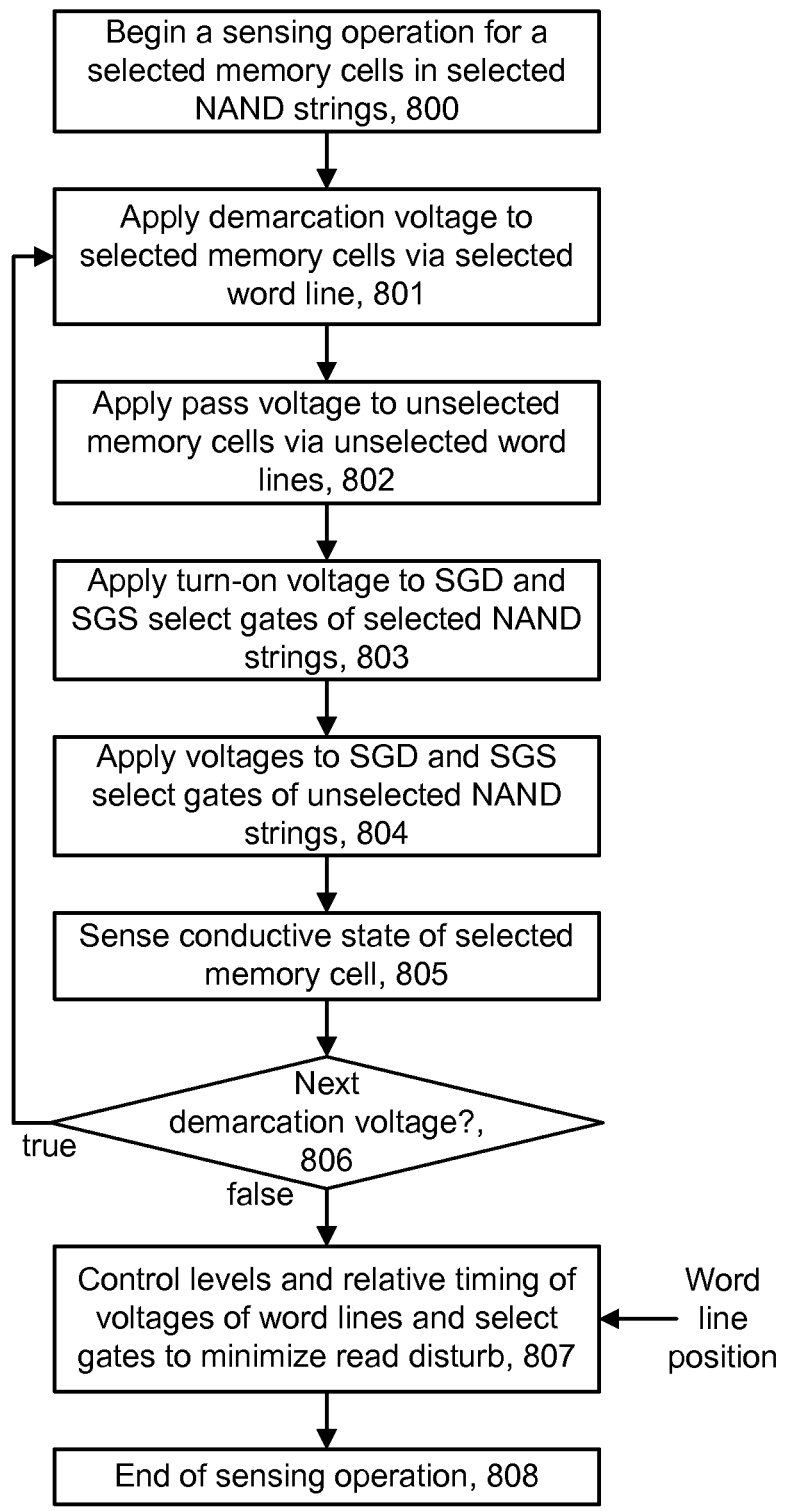

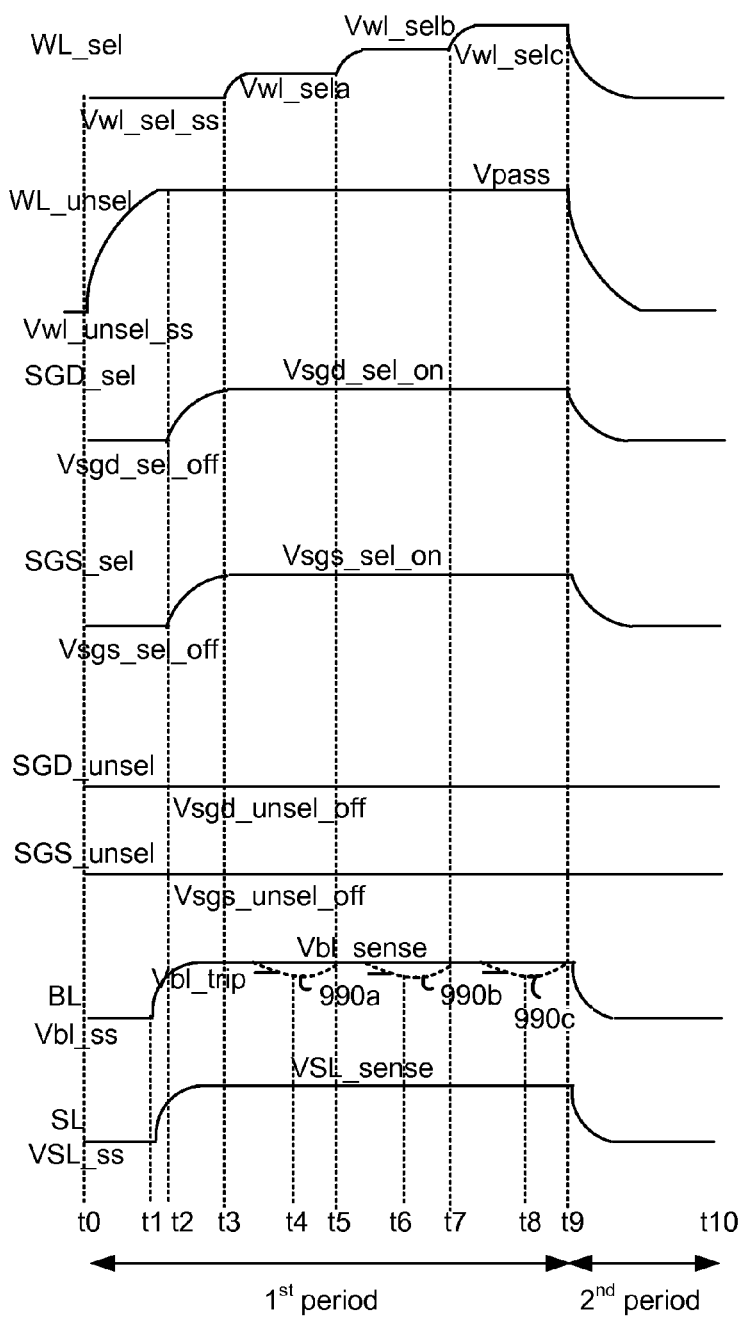

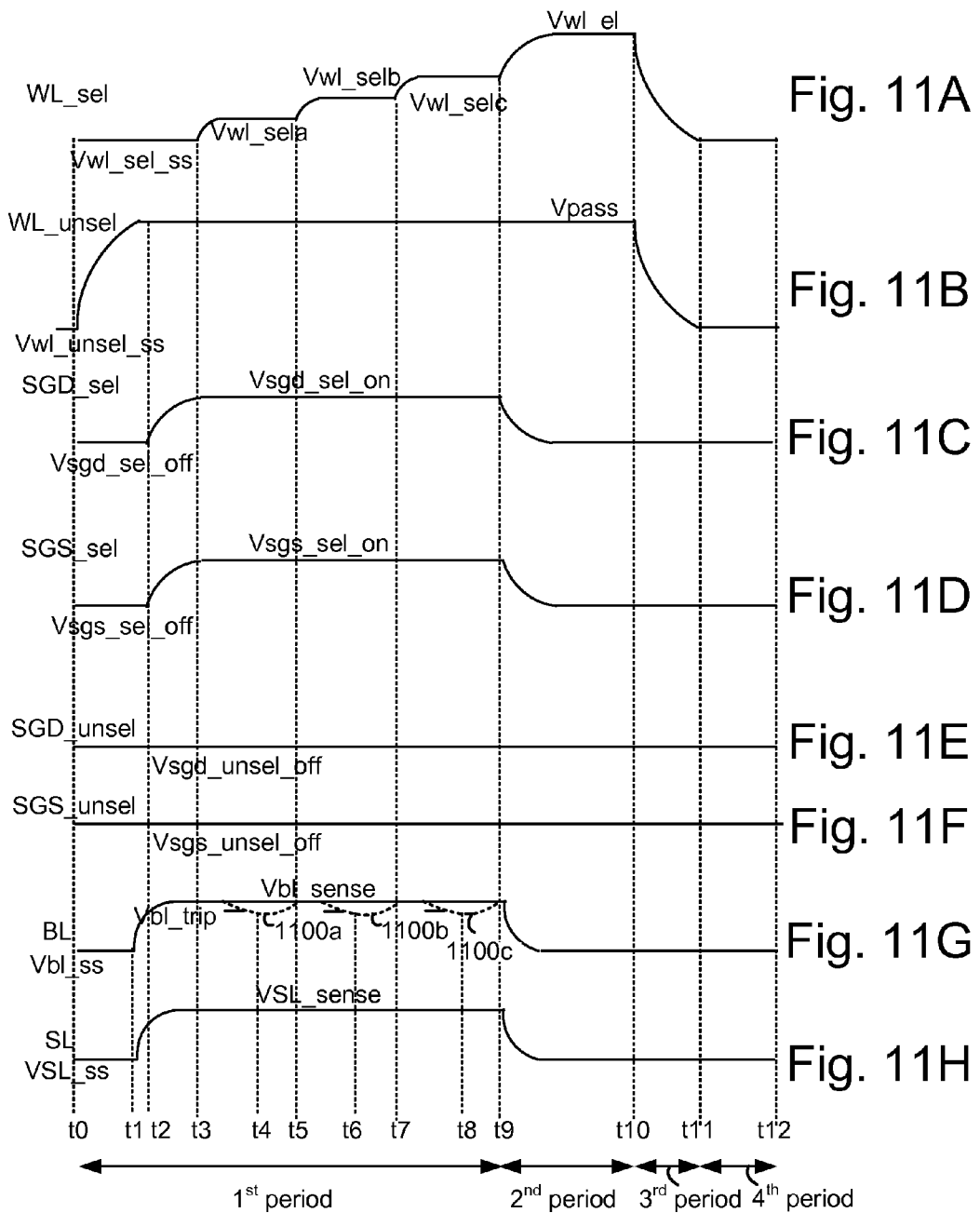

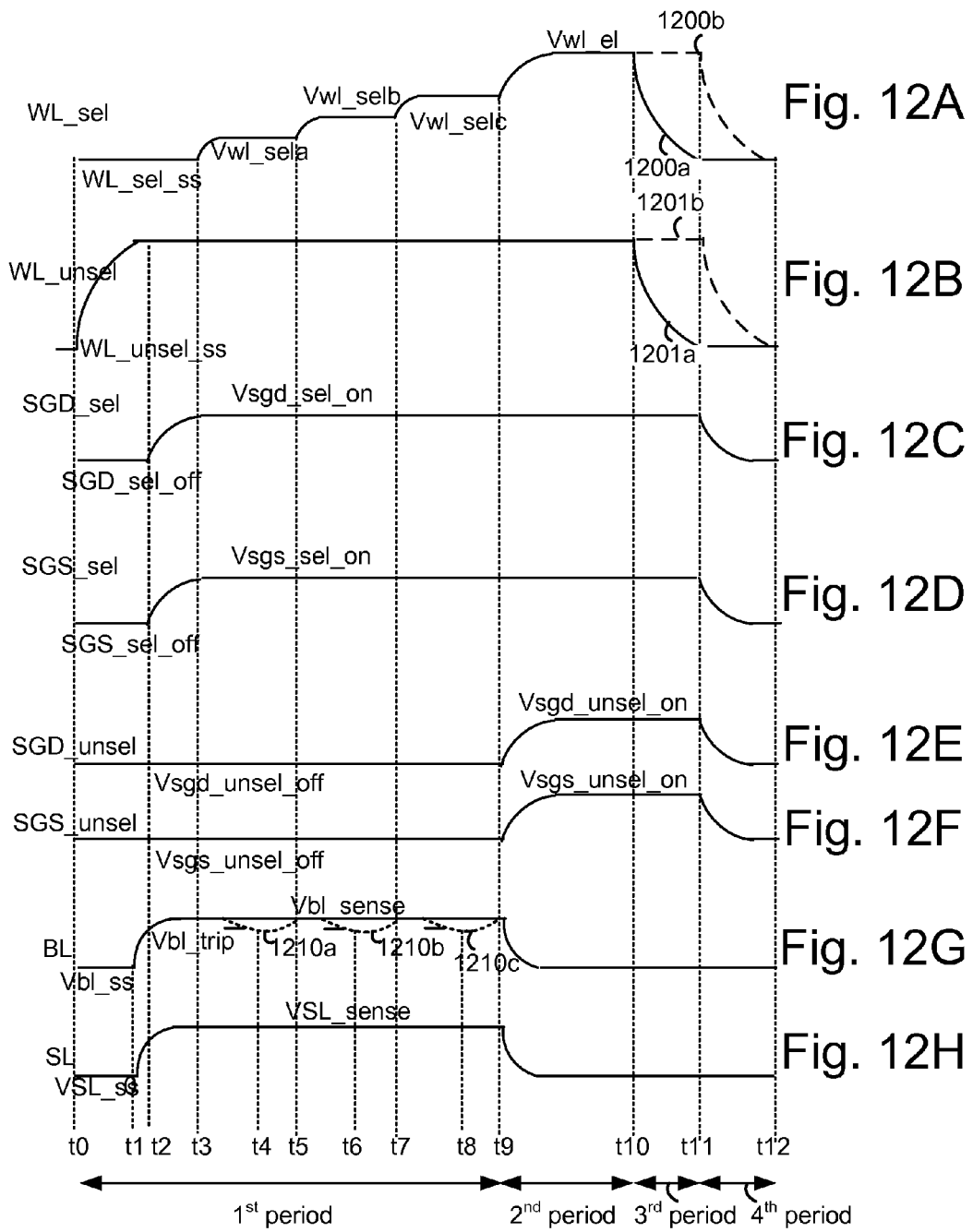

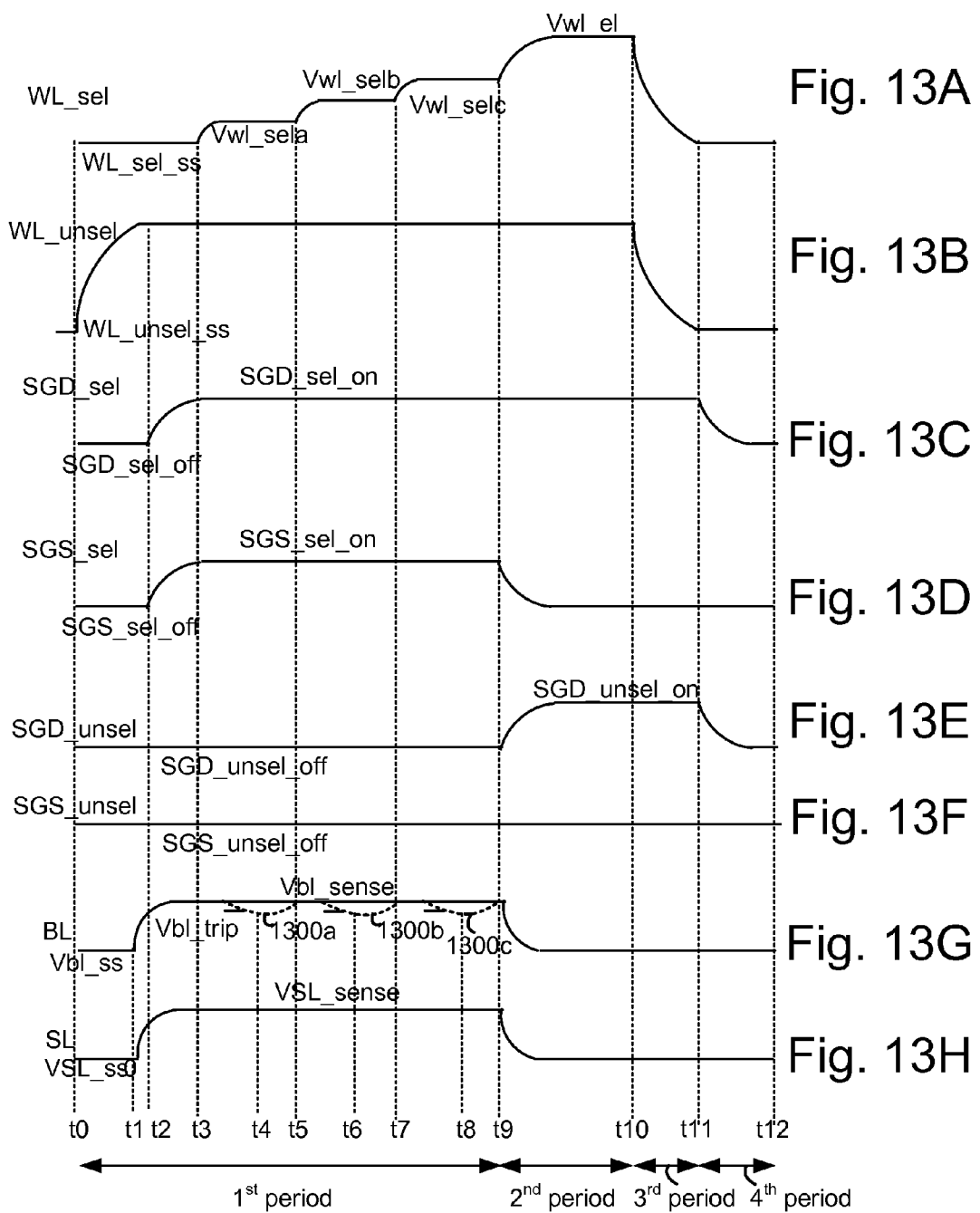

REDUCING HOT ELECTRON INJECTION TYPE OF READ DISTURB IN 3D NON-VOLATILE MEMORY

BACKGROUND

The present technology relates to a memory device and to techniques for operating a memory device.

Recently, ultra high density storage devices have been proposed using a three-dimensional (3D) stacked memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells and of select gate transistors are provided by the conductive layers.

However, various challenges are presented in operating such memory devices.

BRIEF DESCRIPTION OF THE DRAWINGS

Like-numbered elements refer to common components in the different figures.

FIG. 2 depicts code which may be executed by a processor.

FIG. 3 is a block diagram depicting one embodiment of the sense block SB1 of FIG. 1B.

FIG. 4D depicts an alternative view of the select gate layers and word line layers of the stack 440 of FIG. 4C.

FIG. 5 depicts a view of the region 442 of FIG. 4C.

FIG. 8A depicts a flowchart of a sensing operation which minimizes read disturb by controlling levels and timing of voltages of word lines and select gates.

In a comparative sensing operation, FIGS. 10A, 10B, 10C, 10D, 10E, 10F, 10G and 10H, depicts plots, versus time, of a selected word line voltage, an unselected word line voltage, a selected SGD select gate voltage, a selected SGS select gate voltage, an unselected SGD select gate voltage, an unselected SGS select gate voltage, a bit line voltage and a source line voltage, respectively.

In the first sensing operation of FIG. 9A, FIGS. 11A, 11B, 11C, 11D, 11E, 11F, 11G and 11H, depicts plots, versus time, of a selected word line voltage, an unselected word line voltage, a selected SGD select gate voltage, a selected SGS select gate voltage, an unselected SGD select gate voltage, an unselected SGS select gate voltage, a bit line voltage and a source line voltage, respectively.

In the second and third sensing operation of FIG. 9B, FIGS. 12A, 12B, 12C, 12D, 12E, 12F, 12G and 12H, depicts plots, versus time, of a selected word line voltage, an unselected word line voltage, a selected SGD select gate voltage, a selected SGS select gate voltage, an unselected SGD select gate voltage, an unselected SGS select gate voltage, a bit line voltage and a source line voltage, respectively.

In the fourth sensing operation of FIG. 9C, FIGS. 13A, 13B, 13C, 13D, 13E, 13F, 13G and 13H, depicts plots, versus time, of a selected word line voltage, an unselected word line voltage, a selected SGD select gate voltage, a selected SGS select gate voltage, an unselected SGD select gate voltage, an unselected SGS select gate voltage, a bit line voltage and a source line voltage, respectively.

Figure 14A:
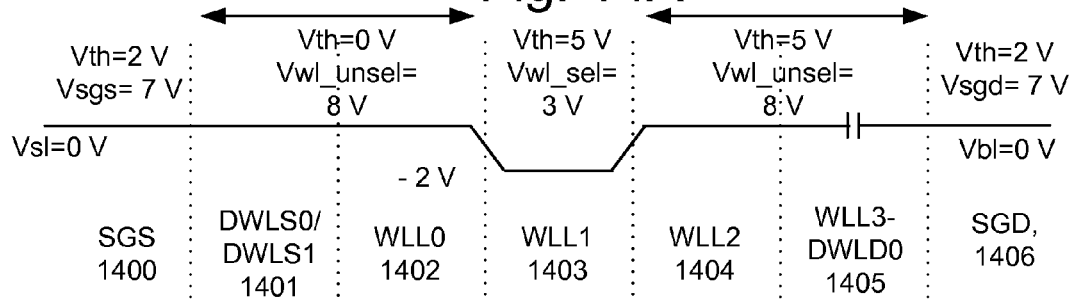

FIG. 14A depicts a plot of a channel voltage (Vch) of a NAND string versus channel position, in a physical model of a NAND string in which a channel portion under a selected word line is non-conductive.

Figure 14B:
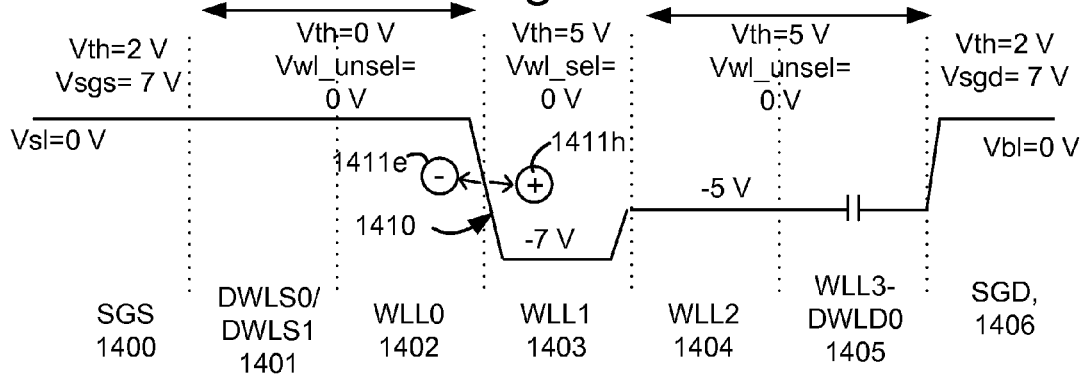

FIG. 14B depicts a plot of Vch versus channel position when the word line voltages are ramped down concurrently with select gates, resulting in a large channel gradient which causes read disturb, consistent with the physical model of FIG. 14A.

Figure 14C:
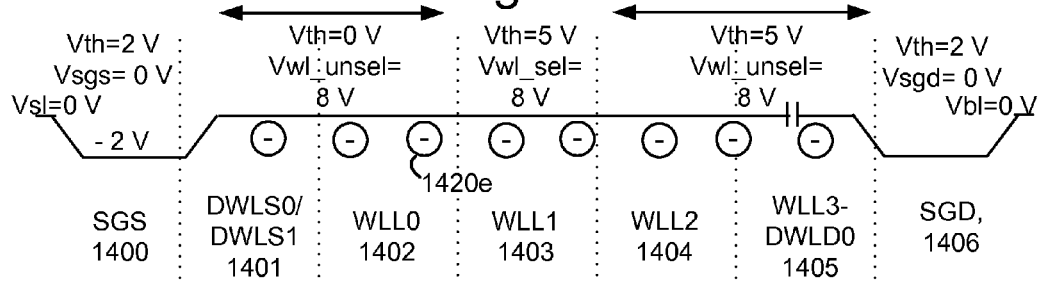

FIG. 14C depicts a plot of Vch versus channel position, in a physical model of a NAND string having trapped electrons in a sensing operation.

Figure 14D:
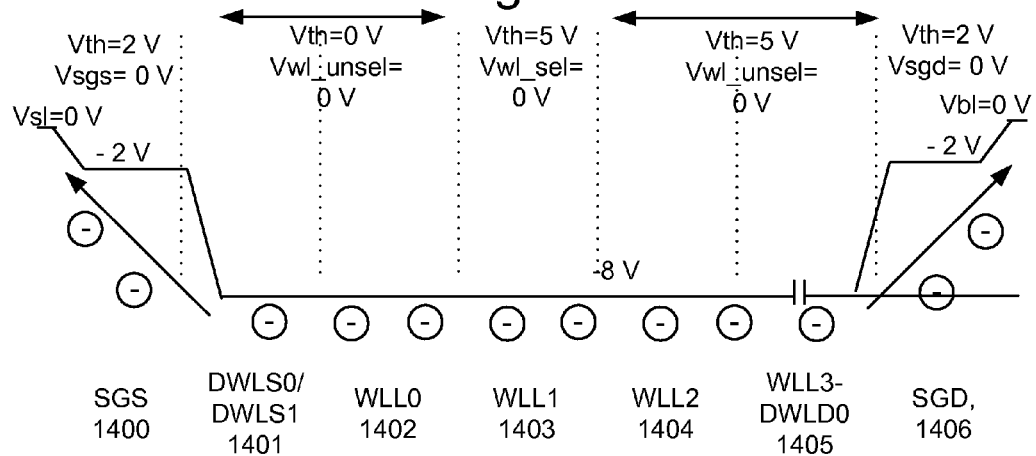

FIG. 14D depicts a plot of Vch versus channel position, when a ramp down of the word line voltages occurs before the ramp down of the select gates, allowing electrons to escape from the channel.

Figure 15A:
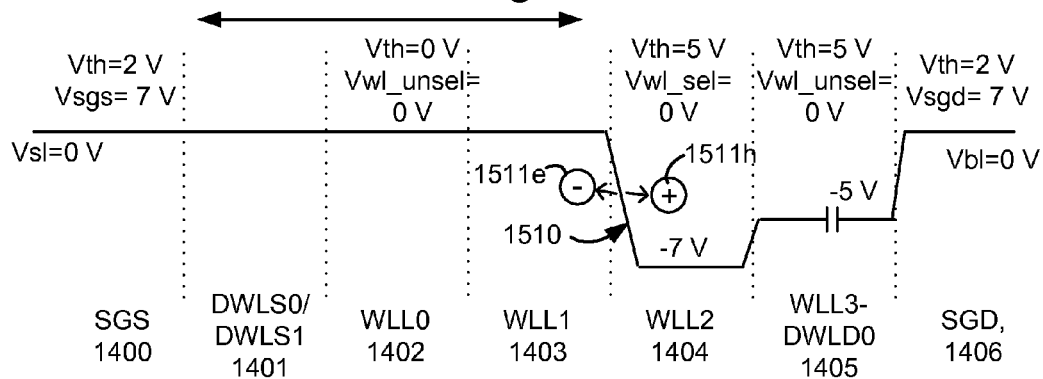

FIG. 15A depicts a plot of Vch versus channel position, where memory cells in the erased state are between a selected memory cell and the driven end of a NAND string, allowing a voltage at the driven end to extend up to a channel portion of the selected memory cell, resulting in a large channel gradient.

Figure 15B:
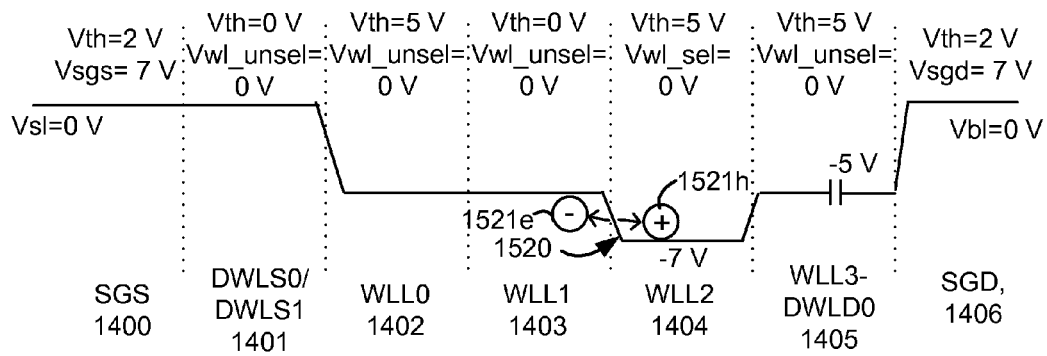

FIG. 15B depicts a plot of Vch versus channel position, where a memory cell in the C state is between a selected memory cell and the driven end of a NAND string, preventing a voltage at the driven end from extending up to a channel portion of the selected memory cell, resulting in a smaller channel gradient compared to FIG. 15A.

Figure 15C:
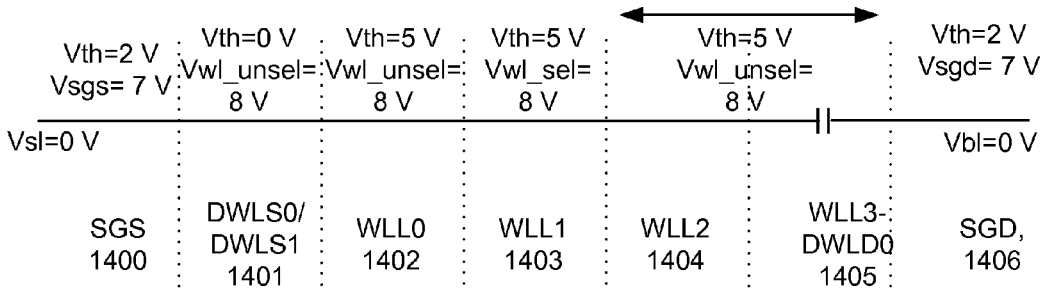

FIG. 15C depicts a plot of Vch versus channel position before the word line voltages are ramped down in a sensing operation, where Vth=5 V and Vwl_sel=8 V for a memory cell connected to the selected word line, as a contrast to FIG. 14A in which Vwl_sel=3 V.

Figure 15D:
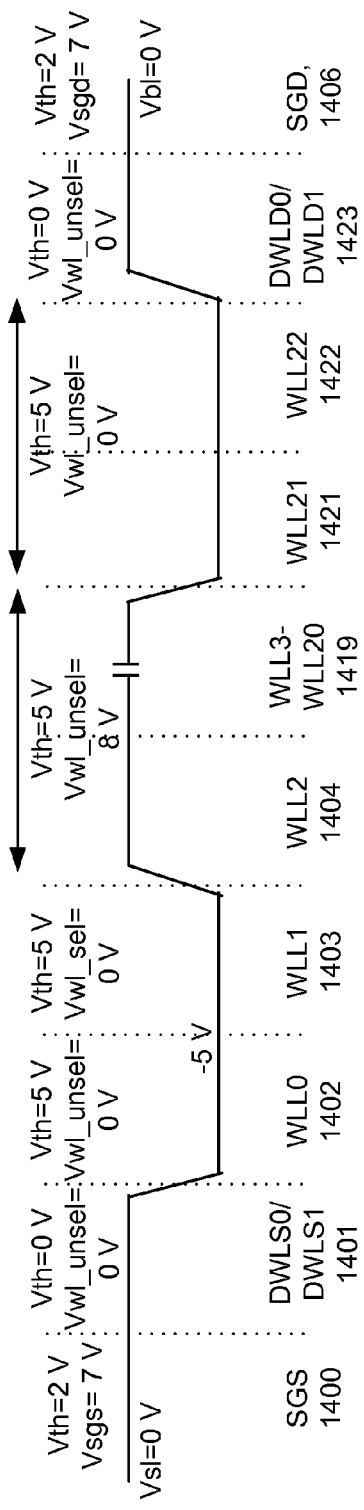

FIG. 15D follows FIG. 15C and depicts Vch versus channel position when voltages of a predefined subset of adjacent edge word lines are ramped down together according to the $2^{nd}$ sensing operation of FIG. 12A-12H.

Figure 15E:
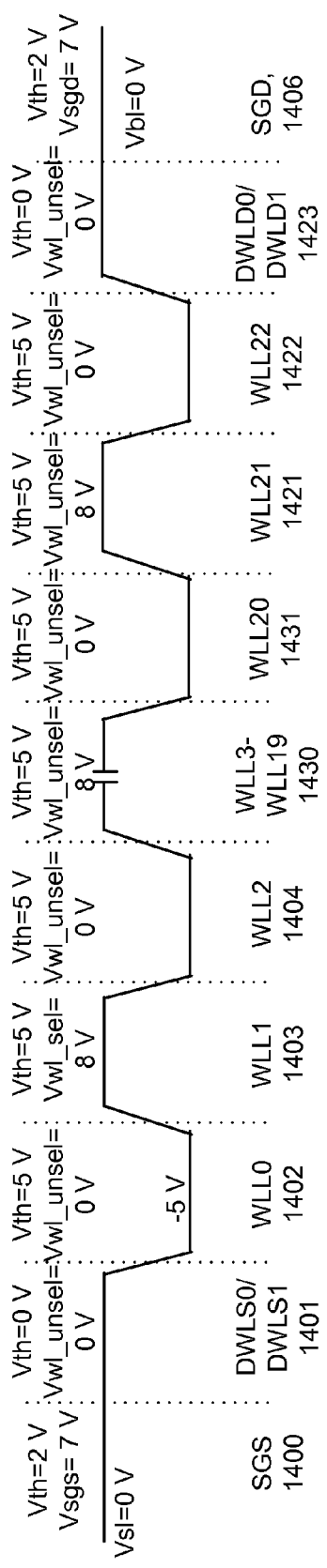

FIG. 15E follows FIG. 15C, and is an alternative to FIG. 15D, where voltages of a predefined subset of non-adjacent edge word lines are ramped down together according to the 2nd sensing operation of FIG. 12A-12H.

DETAILED DESCRIPTION

Techniques are provided for performing a sensing operation in a memory device with reduced read disturb of memory cells.

A charge-trapping memory device may use a charge-trapping material such as silicon nitride or other nitride, or in a multi-layer configuration such as an oxide-nitride-oxide (O—N—O) configuration. The charge-trapping material is separated from a channel layer by a tunneling layer. For example, a charge-trapping memory device may be a 3D memory device in which a stack of alternating conductive and dielectric layers are formed. Memory holes are etched in the stack and films are deposited in the holes such that memory cells or select gate transistors are formed where the conductive layers intersect with the memory holes. The films include a charge-trapping layer which extends vertically along an individual cell or an entire NAND string, a tunneling layer and a channel layer. Some of the conductive layers are used as control gates for memory cells and other conductive layers are used as control gates for select gate transistors, such as drain or source-side transistors in NAND strings. Another example of a charge-trapping memory device is a 2D memory device in which the charge-trapping layer extends horizontally along a NAND string.

In such memory devices, a sensing operation for a selected memory cell can adversely impact the state of unselected memory cells in a process referred to a read disturb. A sensing operation can be, e.g., a read operation in which the data state which is stored in a memory cell is determined after the memory cell has been programmed, or a verify operation which occurs during a programming operation to determine if a memory cell has completed programming. Read disturb can increase the threshold voltage (Vth) of unselected memory cells in a read operation.

For example, the memory device can be arranged in multiple blocks, where each block includes multiple sub-blocks, and a read operation is performed on a selected sub-block. The different sub-blocks can have the same word line layer, bit line and source line biases, but typically have separate select gate (SG) biases for source-side select gate (SGS) transistors or select gates and drain-side select gate (SGD) transistors or select gates. During the read in the selected sub-block, the SGS and SGD select gates of the unselected sub-blocks are typically turned off (made non-conductive) to cut off the conduction paths in unselected strings of the memory cells. A read pass voltage (Vpass) of about 7-9 V is applied to the unselected word line layers, boosting a peak channel voltage of the unselected strings to about 5-6 V. This full measure of boosting is due to capacitive coupling from the unselected word line layers to the channel.

An unselected NAND string has an inhibit status so that memory cells in it are not programmed, while a selected NAND string has a program status so that a selected memory cell, which is connected to a selected word line, is programmed.

This channel boosting can help reduce the occurrence of normal read disturb for the unselected cells of the unselected strings. Normal read disturb is caused by weak Fowler-Nordheim (F-N) tunneling due to a large voltage difference between the control gate and a channel of a cell.

Another type of read disturb is hot electron injection (HEI) type of read disturb. In this case, a channel gradient generates electron-hole pairs in which electrons can be injected into the charge trapping layer of a memory cell, increasing its Vth. For example, when a memory cell is read with a relatively low voltage on the selected word line layer (WLn), a large voltage gradient can be formed in the channel of the NAND string which results in electron/hole generation. This gradient can be formed between the selected word line and either of the adjacent word lines (e.g., WLn+1 on the drain-side of WL or WLn−1 on the source-side of WLn). The generated electrons can be injected into the charge trapping layers of the memory cells connected to the adjacent word lines.

The electron-hole generation occurs in a 3D memory device which has a thin channel and a floating body structure, with no substrate along the length of the channel. This configuration provides good capacitive coupling between the control gate and the channel. However, during signal transient periods, if voltage signals between adjacent word lines are switched between different voltage levels, it is possible that in the transient period of time, the channel potential gradient between two neighbor word lines is large enough to create electron/hole generation and hence HEI type of disturb. This can occur, in particular, during the last phase of a sensing operation when all voltage signals are ramped down to a steady state voltage. Moreover, this type of disturb is prominent particularly after a large amount of read stress.

HEI read disturb has various signature behaviors. For example, it is worse at lower temperatures, and worse on edge word lines when the respective SGD/SGS select gate is conductive (on), and therefore prominent in the selected NAND string. The read disturb is apparent on memory cells of WLn−1 when the selected word line, WLn, is close to the source-side edge of a set of word lines. This is contrary to the previously discussed normal read disturb. Further, at the source-side, the read disturb is worse when the memory cells of WLn and of the higher numbered word lines (above WLn on its drain-side) are in the highest programmed state. For example, this can be the C state when there are four states Er, A, B and C, or the G state when there are eight states Er, A, B, C, D, E, F and G. The read disturb is even worse when more NAND strings have the aforementioned data pattern.

A similar case applies for the drain-side. For example, the read disturb is apparent on memory cells of WLn+1 when WLn is close to the drain-side edge of a set of word lines. This is also contrary to the previously discussed normal read disturb. Further, at the drain-side, the read disturb is worse when the memory cells of WLn and of the lower numbered word lines (below WLn on its source-side) are in the highest programmed state.

Another issue is that electrons can be trapped in a selected NAND string after a verify operation. Specifically, during sensing of a selected NAND string in the verify operation in a program-verify iteration to determine whether a selected memory cell is in a conductive state and has therefore passed a verify test, current flows in the selected NAND string and via a bit line to sensing circuitry. After the sensing has occurred, the selected gates are made non-conductive, trapping some electrons in the channel. If the selected memory cell passes the verify test, the NAND string is labelled as an unselected NAND string in a next program-verify iteration to prevent further programming. However, the presence of the trapped electrons reduces the ability to boost the channel of the NAND string in the next program-verify iteration.

Techniques provided here involve controlling the selected gate and word line voltages in a way which minimizes read disturb. In particular, the techniques reduce HEI read disturb which can occur when word line voltages are ramped down at the end of a sensing operation. The techniques also minimize a reduction in channel boosting for a NAND string which transitions from a program status to an inhibit status.

In a first example sensing operation, the voltages of the SGD and SGS select gates of the selected NAND strings are ramped down before the voltages of the word lines are ramped down. The voltages of the SGD and SGS select gates may be ramped down concurrently. The SGD and SGS select gates of the unselected NAND strings are non-conductive.

In a second example sensing operation, the selected word line is among a predefined subset of word lines, e.g., adjacent or non-adjacent word lines, where this set is adjacent to the edge of the set of word lines so that the risk of read disturb is relatively high. The voltages of the SGD and SGS select gates of the selected NAND strings are ramped down concurrently, and after the voltages of the predefined subset of word lines are ramped down. The voltages of a remaining subset of word lines are ramped down after the ramp down of the predefined subset of word lines, and no later than the ramp down of the voltages of the SGD and SGS select gates of the selected NAND strings. The SGD and SGS select gates of the unselected NAND strings are made temporarily conductive.

In a third example sensing operation, the selected word line is among the remaining subset of word lines predefined subset of word lines so that the voltage of the selected word line is ramped down with the remaining subset of word lines.

In a fourth example sensing operation, the voltage of the SGD select gate of the selected NAND strings is ramped down after the voltages of the word lines are ramped down. The voltage of the SGS select gate of the selected NAND strings is ramped down before the voltages of the word lines are ramped down. The SGD select gates of the unselected NAND strings is made temporarily conductive. The SGS select gates of the unselected NAND strings are non-conductive.

An option in the above sensing operations is to elevate the voltage of the selected word line before it is ramped down to provide an equal or similar amount of ramp down as the adjacent unselected word lines. This reduces differences in capacitive coupling to the channel which can cause a channel gradient.

The following discussion provides details of the construction of example memory devices and of related techniques which address the above and other issues.

Figure 1A:
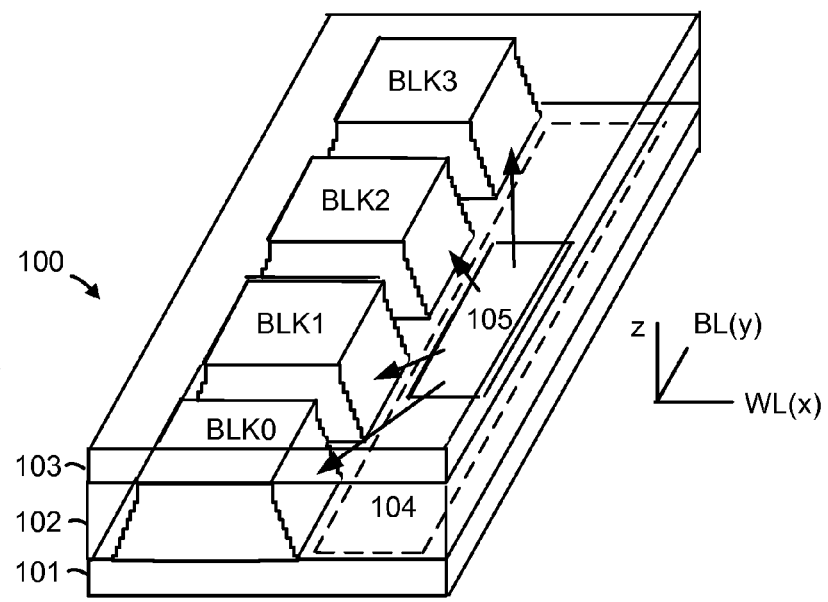
FIG. 1A is a perspective view of a set of blocks in a 3D stacked non-volatile memory device.

FIG. 1A is a perspective view of a set of blocks in a 3D stacked non-volatile memory device. The memory device 100 includes a substrate 101. On the substrate are example blocks BLK0, BLK1, BLK2 and BLK3 of memory cells (storage elements) and a peripheral area 104 with circuitry for use by the blocks. For example, the circuitry can include voltage drivers 105 which can be connected to control gate layers of the blocks. In one approach, control gate layers at a common height in the blocks are commonly driven. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent control gate layers. In one possible approach, the control gate layers of each block at a common height are connected to one another and to a voltage driver. While four blocks are depicted as an example, two or more blocks can be used, extending in the x- and/or y-directions.

Figure 4A:
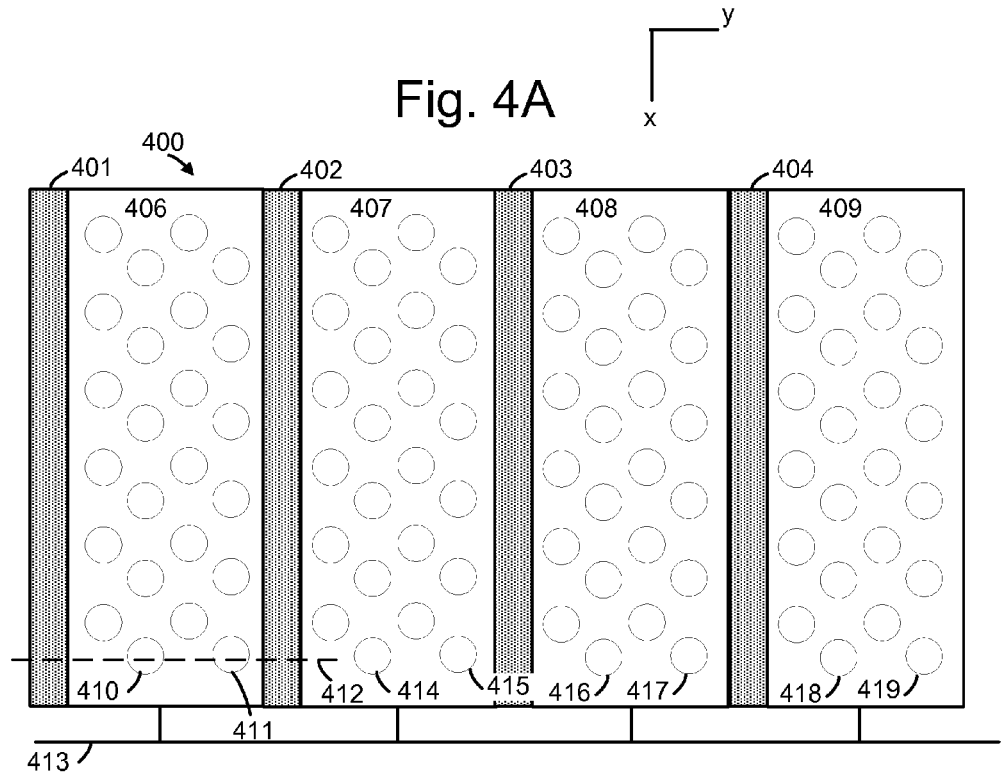
FIG. 4A depicts a top view of an example word line layer 400 of the block BLK0 of FIG. 1A, in a straight NAND string embodiment.
Figure 4B:
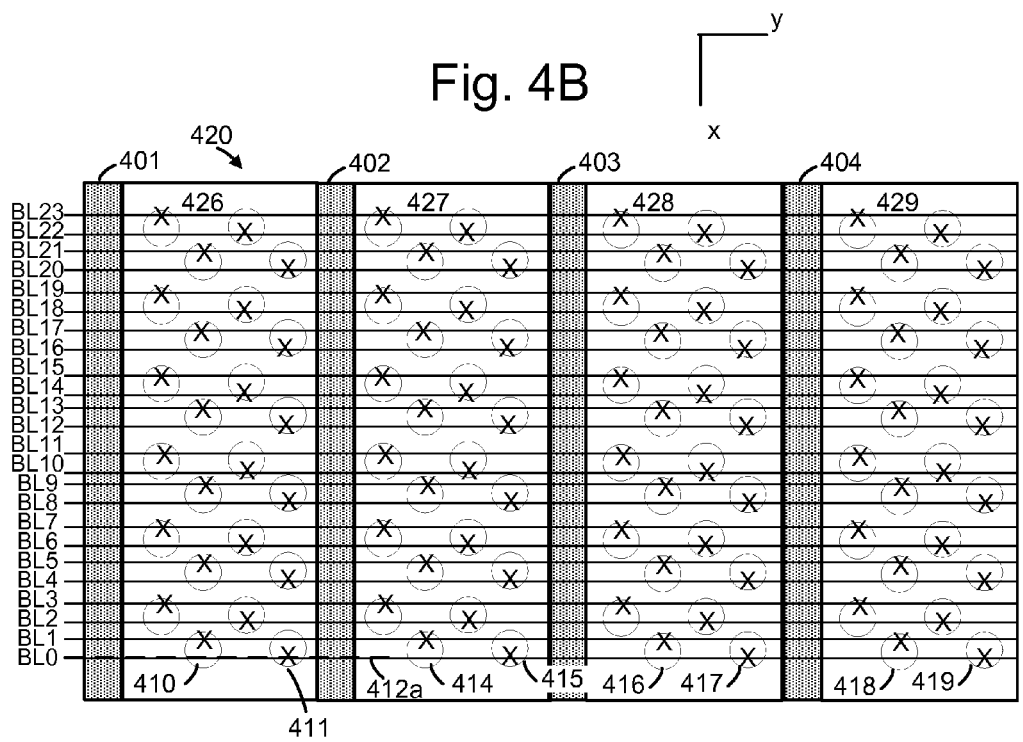
FIG. 4B depicts a top view of an example SGD layer 420, consistent with FIG. 4A.

Each control gate layer in a block can be divided into regions such as depicted in FIGS. 4A, 4B and 4D, in one possible approach.

The length of the plane, in the x-direction, may represent a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
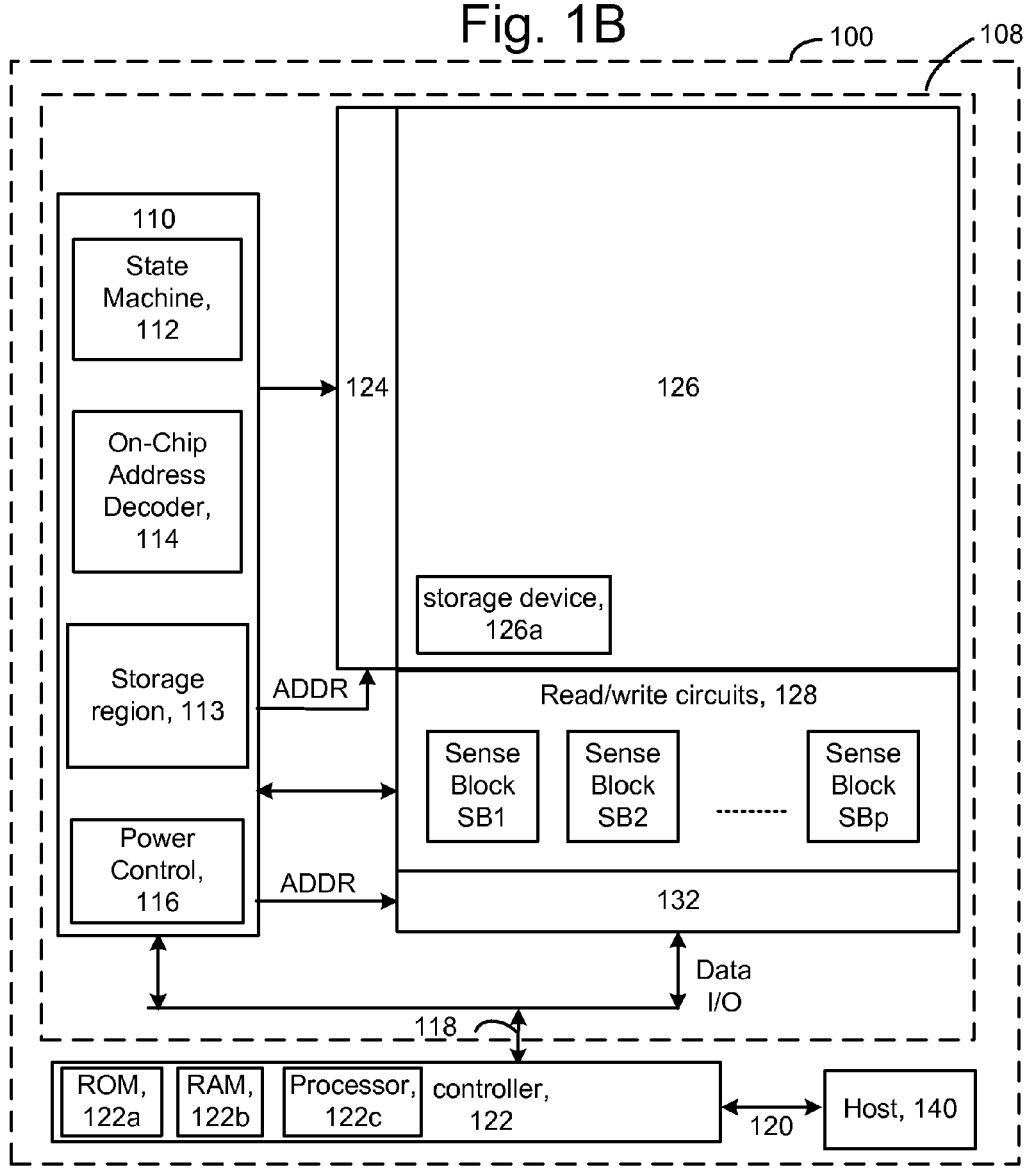
FIG. 1B is a functional block diagram of a memory device such as the 3D stacked non-volatile memory device 100 of FIG. 1A.

FIG. 1B is a functional block diagram of a memory device such as the 3D stacked non-volatile memory device 100 of FIG. 1A. The memory device 100 may include one or more memory die 108. The set of blocks of FIG. 1A can be on one die. The memory die 108 includes a memory structure 126 of memory cells, such as an array of memory cells, control circuitry 110, and read/write circuits 128. In a 3D configuration, the memory structure can include the blocks of FIG. 1A. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120 and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for operating the memory device such as programming parameters for different rows or other groups of memory cells. These programming parameters could include bit line voltages and verify voltages.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD select gates and source lines. The sense blocks can include bit line drivers, in one approach.

An SGS select is a gate transistor at a source-end of a NAND string, and an SGD select gate is a transistor at a drain-end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp, read/write circuits 128, controller 122, and so forth.

The off-chip controller 122 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, FIG. 2 depicts code which may be executed by the processor 122c. The code 150 is used by the controller to access the memory structure such as for programming, read and erase operations. The code can include boot code 151 and control code (e.g., a set of instructions) 160. The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The set of instructions can include, e.g., instructions to perform a programming operation for a set of memory cells (161). These instructions can include instructions for applying a demarcation voltage to a selected word line (161); instructions for determining whether a selected memory cell is in a conductive state (162); instructions for increasing a voltage of the selected word line from the demarcation voltage to an elevated level (163); instructions for concurrently ramping down the word line voltages (164); instructions for ramping down a voltage of a selected source-side select gate line from a respective turn-on voltage, Vsgs_sel_on, to a respective turn-off voltage (165); and instructions for ramping down a voltage of a selected drain-side select gate line from a respective turn-on voltage, Vsgd_sel_on, to a respective turn-off voltage, Vsgd_sel_off (166). Generally, the control code can include instructions to perform the functions described herein including the steps of the flowcharts discussed further below and provide the voltage waveforms including those discussed further below.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

FIG. 3 is a block diagram depicting one embodiment of the sense block SB1 of FIG. 1B. The sense block is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 comprises sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming voltage, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 comprises a processor 192, four example sets of data latches 194, 195, 196 and 197 and an I/O interface 198 coupled between the sets of data latches and the data bus 120. One set of data latches can be provide for each sense module, and may include data latches identified by LDL and UDL. LDL stores a bit for a lower page (LP) of write data, and UDL stores a bit for an upper page (UP) of write data, in a memory which stores two bits of data in each memory cell.

Additional data latches could be used as well. For example, in a three-bit per memory cell implementation, one extra data latch may be used to store a middle page (MP) of data. A four-bit per memory cell implementation can use lower-middle and upper-middle data latches. The techniques provided herein are meant to encompass such variations. In a further option, another latch is used to identify whether a memory cell is in a slow programming mode when its Vth is within a specified margin of the verify voltage of its target data state.

The processor 192 performs computations during reading and programming. For reading, the processor determines the data state stored in the sensed memory cell and stores the data in the set of data latches. For full programming and refresh programming, the processor reads the latches to determine the data state which is to be written to a memory cell.

During reading, the operation of the system is under the control of the state machine 112 which controls the supply of different control gate voltages to the addressed memory cell. As it steps through the various predefined control gate voltages (e.g., VrEr/A, VrA/B and VrB/C in FIG. 6) corresponding to the various memory states supported by the memory (e.g., states A, B and C), the sense module may trip at one of these voltages and a corresponding output will be provided from the sense module to the processor 192 via the data bus 172. At that point, processor 192 determines the memory state by consideration of the tripping event(s) of the sense module and the information about the applied control gate voltage from the state machine via input lines 193. It then computes a binary encoding for the memory state and stores the resultant data bits into the sets of data latches 194-197. In another embodiment of the managing circuit MC0, the bit line latch serves both as a latch for latching the output of the sense module and also as a bit line latch as described above.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense modules, the state machine needs to read the wired-OR line four times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP and UP data latches. The programming operation, under the control of the state machine, comprises a series of programming voltage pulses applied to the control gates of the addressed memory cells. Each programming voltage is followed by a read back (verify test) to determine if the memory cell has been programmed to the desired memory state. In some cases, processor monitors the read back memory state relative to the desired memory state. When the two states agree, the processor sets the bit line latch to cause the bit line to be pulled to a state designating program inhibit (e.g., 2-3 V). This inhibits the memory cell coupled to the bit line from further programming even if programming voltages appear on its control gate. In other embodiments, the processor initially loads the bit line latch and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

FIG. 4A depicts a top view of an example word line layer 400 of the block BLK0 of FIG. 1A, in a straight NAND string embodiment. As mentioned, a word line layer in each block in FIG. 1A can be divided into regions. Each region can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figures and other are not necessarily to scale. In practice, the regions can be much longer in the x-direction relative to the y-direction than is depicted to accommodate additional memory holes.

In this example, there are four rows of memory holes between adjacent slits. A row here is a group of memory holes which are aligned in the x-direction. Moreover, the rows of memory holes are in a staggered pattern to increase the density of the memory holes. The word line layer is divided into regions 406, 407, 408 and 409 which are each connected by a connector 413. The last region of a word line layer in a block can be connected to a first region of a word line layer in a next block, in one approach. The connector, in turn, is connected to a voltage driver for the word line layer. The region 406 has example memory holes 410 and 411 along a line 412. See also FIG. 4C. The region 407 has example memory holes 414 and 415. The region 408 has example memory holes 416 and 417. The region 409 has example memory holes 418 and 419.

Each circle represents the cross-section of a memory hole at a word line layer or select gate layer. Each circle can alternatively represent a memory cell which is provided by the materials in the memory hole and by the adjacent word line layer.

Metal-filled slits 401, 402, 403 and 404 (e.g., metal interconnects) may be located between and adjacent to the edges of the regions 406-409. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device.

FIG. 4B depicts a top view of an example SGD layer 420, consistent with FIG. 4A. The SGD layer is divided into regions 426, 427, 428 and 429. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region 426 has the example memory holes 410 and 411 along a line 412a which is coincident with a bit line BL0. See also FIG. 4C. The region 427 also has the example memory hole 414 which is coincident with a bit line BL1. A number of bit lines extend above the memory holes and are connected to the memory holes as indicated by the "X" symbols. BL0 is connected to a set of memory holes which includes the memory holes 411, 415, 417 and 419. Another example bit line BL1 is connected to a set of memory holes which includes the memory holes 410, 414, 416 and 418. The metal-filled slits 401, 402, 403 and 404 from FIG. 4A are also depicted, as they extend vertically through the stack. The bit lines can be numbered in a sequence BL0-BL23 across the SGD layer 420 in the −x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

Figure 4C:
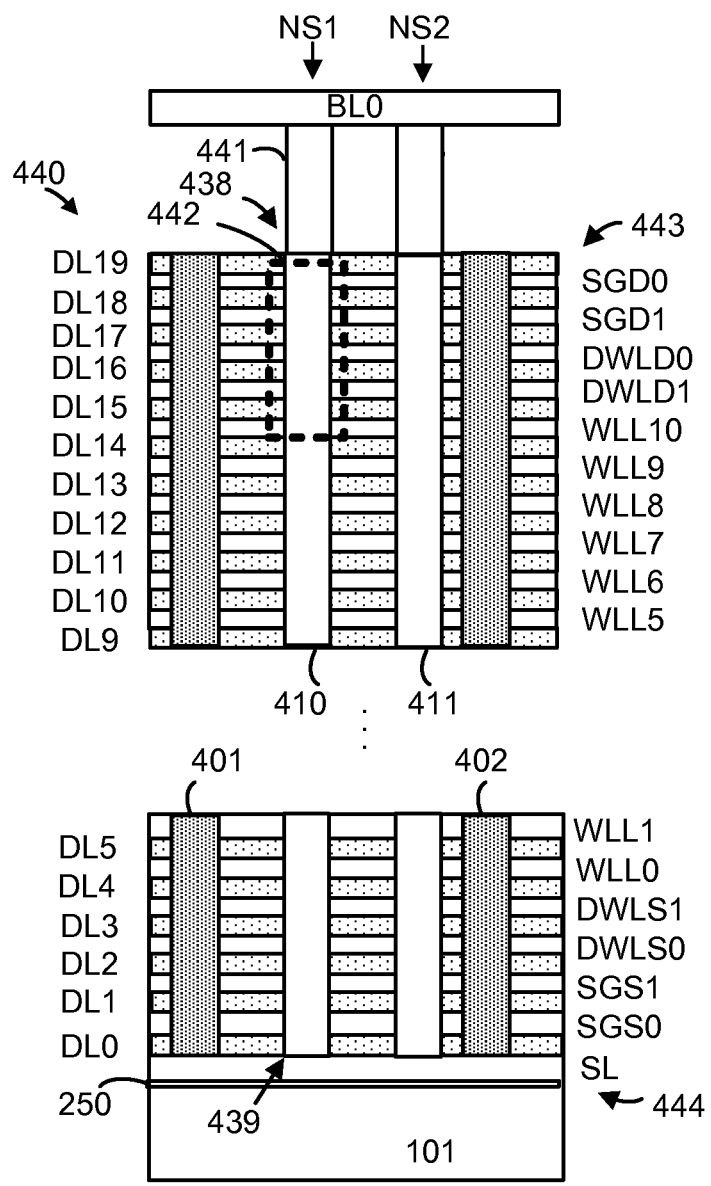
FIG. 4C depicts an embodiment of a stack 440 showing a cross-sectional view along line 412 of FIG. 4A and line 412a of FIG. 4B.

FIG. 4C depicts an embodiment of a stack 440 showing a cross-sectional view along line 412 of FIG. 4A and line 412a of FIG. 4B. Two SGD layers, two SGS layers and four dummy word line layers DWLD0, DWLD1, DWLS0 and DWLS1 are provided, in addition to the data word line layers WLL0-WLL10. Columns of memory cells corresponding to NAND strings NS1 and NS2 are depicted in the multi-layer stack. The stack includes a substrate 101, an insulating film 250 on the substrate, and a portion of a source line SL. NS1 has a source-end 439 at a bottom 444 of the stack and a drain-end 438 at a top 443 of the stack. The metal-filled slits 401 and 402 from FIGS. 4A and 4B are also depicted. A portion of the bit line BL0 is also depicted. A conductive via 441 connects the drain-end 438 to BL0. A region 442 of the stack is shown in greater detail in FIG. 5.

FIG. 4D depicts an alternative view of the select gate layers and word line layers of the stack 440 of FIG. 4C. The SGD layers SGD0 and SGD0 each includes parallel rows of select gate lines associated with the drain-side of a set of NAND strings. For example, SGD0 includes drain-side select gate regions 426, 427, 428 and 429, consistent with FIG. 4B.

Below the SGD layers are the drain-side dummy word line layers. Each dummy word line layer represents a word line, in one approach, and is connected to a set of dummy memory cells at a given height in the stack. For example, DWLD0 comprises word line layer regions 450, 451, 452 and 453. A dummy memory cell, also referred to as a non-data memory cell, does not store data and is ineligible to store data, while a data memory cell is eligible to store data. Moreover, the Vth of a dummy memory cell is generally fixed at the time of manufacturer or may be periodically adjusted, while the Vth of the data memory cells changes more frequently, e.g., during erase and programming operations of the data memory cells.

Below the dummy word line layers are the data word line layers. For example, WLL10 comprises word line layer regions 406, 407, 408 and 409, consistent with FIG. 4A.

Below the data word line layers are the source-side dummy word line layers.

Below the source-side dummy word line layers are the SGS layers. The SGS layers SGS0 and SGS1 each includes parallel rows of select gate lines associated with the source-side of a set of NAND strings. For example, SGS0 includes source-side select gate lines 454, 455, 456 and 457. Each select gate line can be independently controlled, in one approach. Or, the select gate lines can be connected and commonly controlled.

FIG. 5 depicts a view of the region 442 of FIG. 4C. SGD select gates 480 and 481 are provided above dummy memory cells 482 and 483 and a data memory cell MC. A number of layers can be deposited along the sidewall (SW) of the memory hole 410 and/or within each word line layer, e.g., using atomic layer deposition. For example, each column (e.g., the pillar which is formed by the materials within a memory hole) can include a charge-trapping layer or film 463 such as SiN or other nitride, a tunneling layer 464, a polysilicon body or channel 465, and a dielectric core 466. A word line layer can include a blocking oxide 470, a block high-k material 460, a metal barrier 461, and a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the WLLs in each of the memory holes.

In some cases, the tunneling layer 464 can comprise multiple layers such as in an oxide-nitride-oxide configuration.

The NAND string can be considered to have a floating body channel because the length of the channel is not formed on a substrate. Further, the NAND string is provided by a plurality of word line layers above one another in a stack, and separated from one another by dielectric layers.

Figure 6:
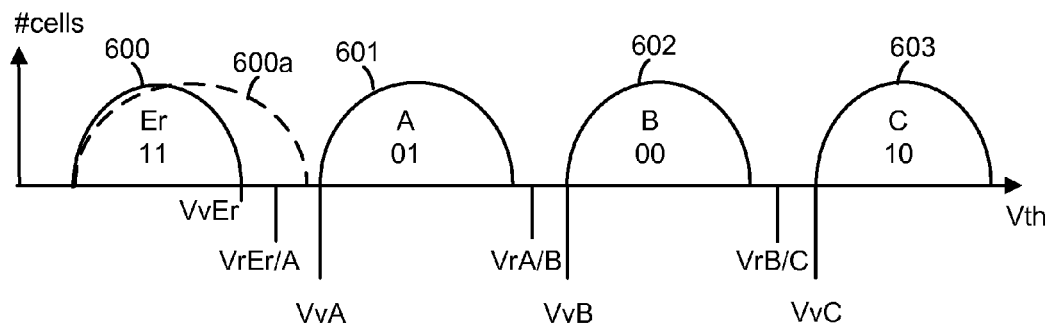
FIG. 6 depicts a threshold voltage (Vth) distribution and example read and verify voltages for a set of memory cells.

FIG. 6 depicts a threshold voltage (Vth) distribution and example read and verify voltages for a set of memory cells. The horizontal axis represents Vth and the vertical axis represents a number of memory cells on a logarithmic scale. The Vth distributions are shown in a simplified form for clarity.

In one approach, a one programming pass operation, also referred to as full sequence programming, involves (only) one sequence of multiple program-verify operations (or program loops) which are performed starting from an initial Vpgm level and proceeding to a final Vpgm level until the threshold voltages of a set of selected memory cells reach one or more respective verify voltages of respective target data states. All memory cells may initially be in an erased state at the beginning of the programming pass.

Example Vth distributions for the memory cell array are provided for a case where each memory cell stores two bits of data in one of four possible Vth ranges. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A bit combination is stored in a set of latches such as discussed previously. For example, the LP bit can be stored in LDL and the UP bit can be stored in UDL. In another example, each memory cell stores three bits of data in one of eight possible Vth ranges.

The Vth distributions 600 and 600a represent the erased (Er) state memory cells without read disturb and with read disturb, respectively. Read disturb primarily affects the erased state cells and increases the upper tail of the Vth distribution. The increase in the Vth may be large enough for some memory cells such that they cannot be read back accurately. Vth distributions 601, 602 and 603 represent target data states A, B and C, respectively, which are reached by memory cells when their Vth exceeds the verify voltage VvA, VvB or VvC, respectively. A verify operation or test is performed to determine whether the Vth of a memory cell exceeds a verify voltage. VvEr is an erase verify voltage.

After the programming pass is completed, the data can be read from the memory cells using read reference voltages VrEr/A, VrA/B and VrB/C which are between the Vth distributions. By testing whether the Vth of a given memory cell is above or below one or more of the read reference voltages, the system can determine the data state which is represented by a memory cell.

Figure 7A:
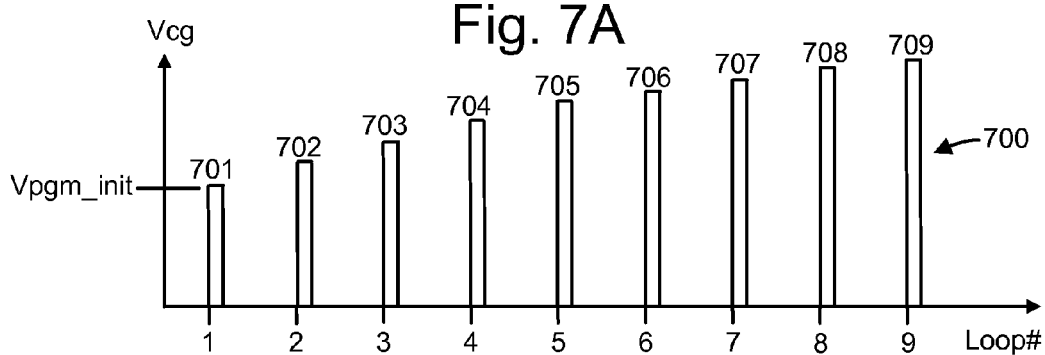
FIG. 7A depicts a set of program voltages in a programming operation.
Figure 7B:
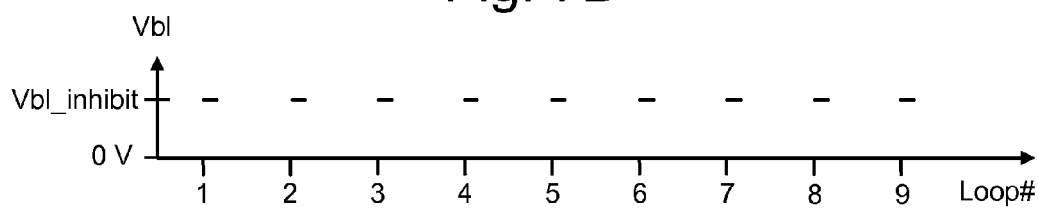
FIG. 7B depicts a set of bit line voltages in a programming operation, consistent with FIG. 7A.
Figure 7C:
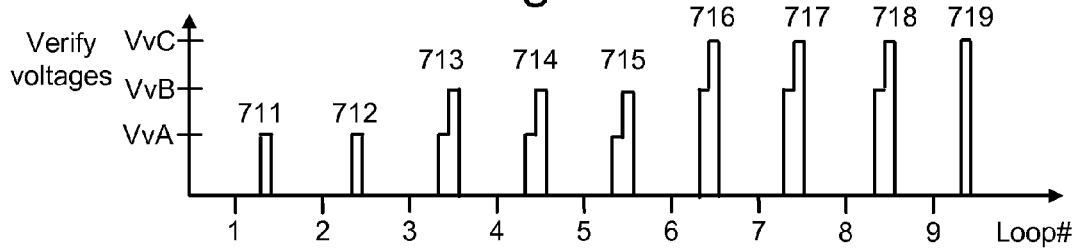
FIG. 7C depicts a set of verify voltages in a programming operation, consistent with FIG. 7A.

FIG. 7A depicts a set of program voltages in a programming operation. The vertical axis depicts Vcg, a control gate or word line voltage, and the horizontal axis depicts time or program loop number (e.g., program-verify iteration number). A one pass programming operation with four data states is depicted in FIG. 7A-7C. Other options are possible. The programming operation comprises a series of waveforms 700 comprising program voltages 701-709. Incremental step pulse programming is performed, such that Vpgm begins at an initial level, Vpgm_init and increases step-wise in each program loop. This example also performs verify tests based on the program loop (see FIG. 7C). For example, the A state cells are verified in loops 1 and 2, the A and B state cells are verified in loops 3-5, the B and C state cells are verified in loops 6-8 and the C state cells are verified in loop 9. The horizontal axes of FIG. 7A-7C are time-aligned.

FIG. 7B depicts a set of bit line voltages in a programming operation, consistent with FIG. 7A. Vbl_inhibit may be applied to the bit lines for the memory cells with a lockout or inhibit status (e.g., the erased state cells or the memory cells which have completed programming to a target data state). Vbl=0 V may be applied to the memory cells with a program status.

FIG. 7C depicts a set of verify voltages in a programming operation, consistent with FIG. 7A. Waveforms 711 and 712 in program loops 1 and 2, respectively, have a magnitude of VvA. Waveforms 713, 714 and 715 in program loops 3, 4 and 5, respectively, have a magnitude of VvA and VvB. Waveforms 716, 717 and 718 in program loops 6, 7 and 8, respectively, have a magnitude of VvB and VvC. Waveform 719 in program loop 9 has a magnitude of VvC. Specifically, in program loops 1 and 2, sensing occurs for the A state cells at VvA. In program loops 3, 4 and 5, sensing occurs for the A state cells at VvA and for the B state cells at VvB. In program loops 6, 7 and 8, sensing occurs for the B state cells at VvB and for the C state cells at VvC. In program loop 9, sensing occurs for the C state cells at VvC. This approach minimizes the number of verify operations by considering that memory cells with lower target data states will pass a verify test earlier in the programming operation than memory cells with higher target data states.

FIG. 8A depicts a flowchart of a sensing operation which minimizes read disturb by controlling levels and timing of voltages of word lines and select gates. Step 800 begins a sensing operation for selected memory cells. These are memory cells which are connected to a selected word line among a plurality of word lines and in a selected region or sub-block. For a read operation, typically a set of adjacent memory cells of the selected word line are sensed concurrently. For a verify operation, memory cells of the selected word line are sensed if they have a program status as indicated by latches of the associated NAND strings. Step 801 involves applying a demarcation voltage to the selected memory cells via the selected word line. For example, for a read operation in which there are four data states, the demarcation voltages may be VrEr/A, VrA/B and VrB/C. For a verify operation in which there are four data states, the demarcation voltages may be VvA, VvB and VvC.

Step 802 involves applying a pass voltage to the unselected memory cells via the unselected word lines. This voltage is high enough to provide the unselected memory cells in a conductive state so they do not interfere with the sensing of the selected memory cells. Step 803 involves applying a turn-on voltage to the SGD and SGS select gates for the selected NAND strings. This allows a current to flow in the selected NAND strings to sensing circuitry.

Step 804 involves applying voltages to the SGD and SGS select gates for the unselected NAND strings. Various options are possible, as discussed further below. Step 805 involves the sensing circuitry determining whether the selected memory cells are in a conductive state, such as by evaluating the current in a NAND string. Note that steps 801-805 may occur at the same time. A decision step 806 determines whether there is a next demarcation voltage to apply. If this decision step is true, a next demarcation voltage is applied at step 801. If this decision step is false, step 807 involves controlling the levels and timing of voltages of the word lines and select gates to minimize read disturb. Additional details are provided further below. Step 808 represents the end of the sensing operation. For a read operation, the controller may subsequently perform some other task such as a read operation for another region or word line, or a program or erase operation, or enter an idle state, for instance. For a programming operation, the controller may subsequently perform a next program-verify iteration or end the programming operation.

Figure 8B:
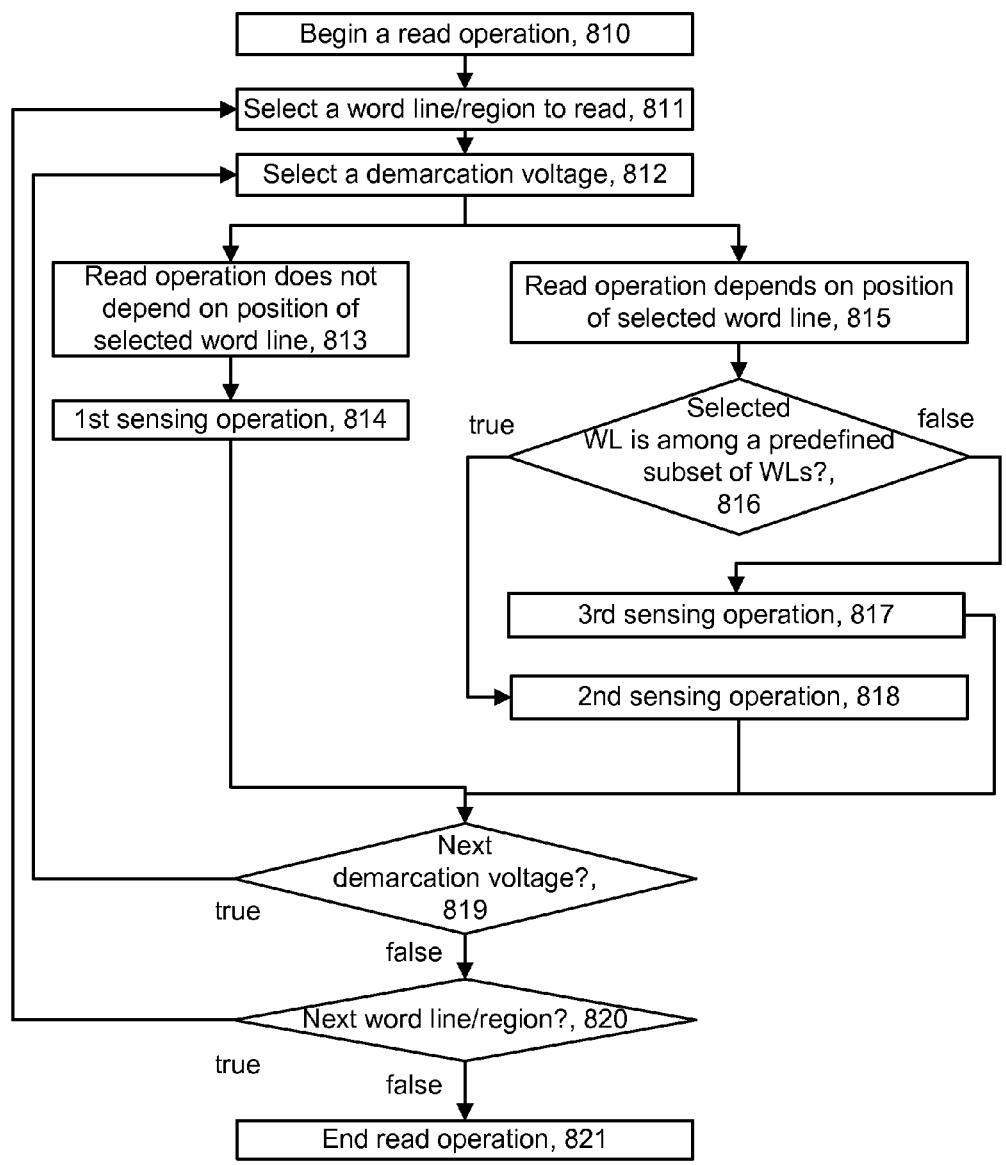
FIG. 8B depicts a read operation which is an example implementation of the process of FIG. 8A.

FIG. 8B depicts a read operation which is an example implementation of the process of FIG. 8A. A read operation begins at step 810. Step 811 selects a word line and word line layer region to read. Step 812 selects a demarcation voltage. Subsequently, one of two paths can be followed. In a first path, at step 813, the read operation does not depend on the position of the selected word line. This approach may be used to provide a simplified implementation and when the amount of read disturb which results from a first sensing operation is acceptable. Step 814 involves performing the first sensing operation, discussed, e.g., in connection with FIG. 9A and FIG. 11A-11H. A decision step 819 determines whether there is a next demarcation voltage to apply. If decision step 819 is true, a next demarcation voltage is applied at step 812. If decision step 819 is false, a decision step 820 determines whether there is a next word line or region to read. If decision step 820 is false, step 821 represents the end of the read operation. If decision step 820 is true, a next word line or region to read is selected at step 811.

In a second path after step 812, at step 815, the read operation depends on the position of the selected word line. This approach may be used to tailor the read operation according to the likelihood of read disturb occurring when reading the currently selected word line. This approach can minimize the worst case read disturb. For example, read disturb may be relatively more likely when the selected word line is relatively close to the drain and/or source-side of the plurality of word lines of a block, than when the selected word line is among middle word lines. The controller can be programmed to apply the appropriate sensing procedure according to the word line position.

A decision step 816 determines whether the selected word line is among a predefined subset of word lines. For example, this can include a set of adjacent drain-side and/or source-side word lines (see, e.g., FIG. 15D), or a set of non-adjacent drain-side and/or source-side word lines (see, e.g., FIG. 15E). If this decision step is true, step 818 involves performing a second sensing operation, discussed, e.g., in connection with FIG. 9B and FIG. 12A-12H. If this decision step is false, the selected word line is among a remaining subset of word lines, and step 817 involves performing a third sensing operation, discussed, e.g., in connection with FIG. 9B and FIG. 12A-12H. The decision step 819, discussed previously, is then reached.

Generally, in the selected NAND string, the memory cells of the edge word lines on both the drain-side and the source-side of the set of word lines see a large read disturb and the memory cells of the middle word lines see little disturb. In the unselected NAND strings, only the memory cells of the source-side edge word lines see a large disturb and the memory cells of the drain-side word line see little disturb. Accordingly, to minimize read disturb in a selected NAND string, the read waveforms can be different for the drain-side and/or source-side word lines compared to the remaining, middle word lines.

Figure 8C:
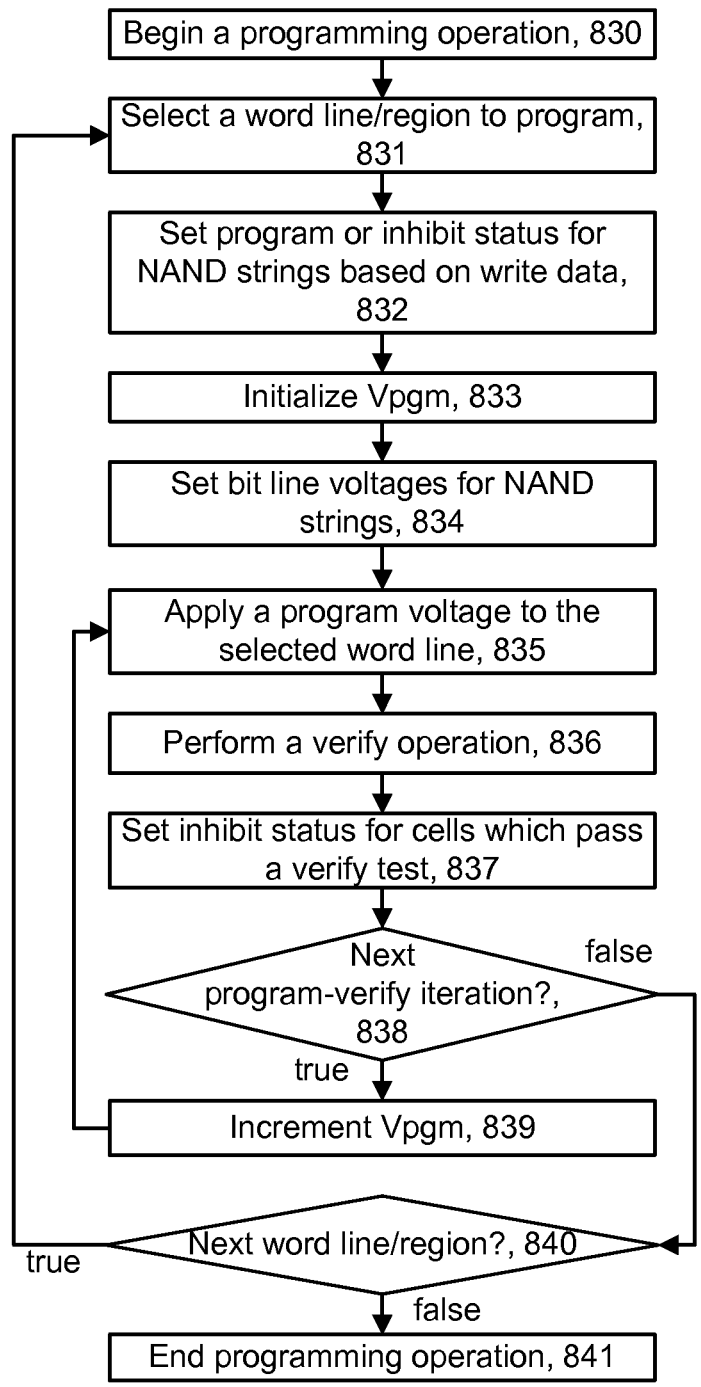
FIG. 8C depicts a programming operation which is another example implementation of the process of FIG. 8A.

FIG. 8C depicts a programming operation which is another example implementation of the process of FIG. 8A. At step 830, a programming operation begins. Step 831 selects a word line and word line layer region to program. Step 832 sets a program or inhibit status for the NAND strings based on the write data. Step 833 initializes a program voltage, Vpgm. For example, region 406 in FIG. 4A may be selected for programming, after which regions 407, 408 and 409 are selected in turn for programming in the selected word line layer. Step 834 sets bit line voltages for the NAND strings. For example, the bit line voltage may be 0 V for a NAND string with a program status and 2-3 V for a NAND string with an inhibit status. See FIG. 7B. Each memory cell in the region can be connected to a respective bit line via a drain-end of a NAND string in which the memory cell is located. Step 835 applies a program voltage to the selected word line. See FIG. 7A.

Step 836 performs a verify operation. See FIG. 8D. Step 837 sets an inhibit status for cells which pass a verify test.

A decision step 838 determines whether there is a next program-verify iteration for the word line and region. This is false if all or nearly all of the memory cells in the region have been programmed. If decision step 838 is true, step 839 increments Vpgm and step 835 begins the next program-verify iteration by applying another program voltage. If decision step 838 is false, a decision step 840 determines whether there is a next word line or region of memory cells to program. If decision step 840 is true, step 831 selects another word line and region of memory cells to program. If decision step 840 is false, the programming operation for the word line/region ends at step 841.

Figure 8D:
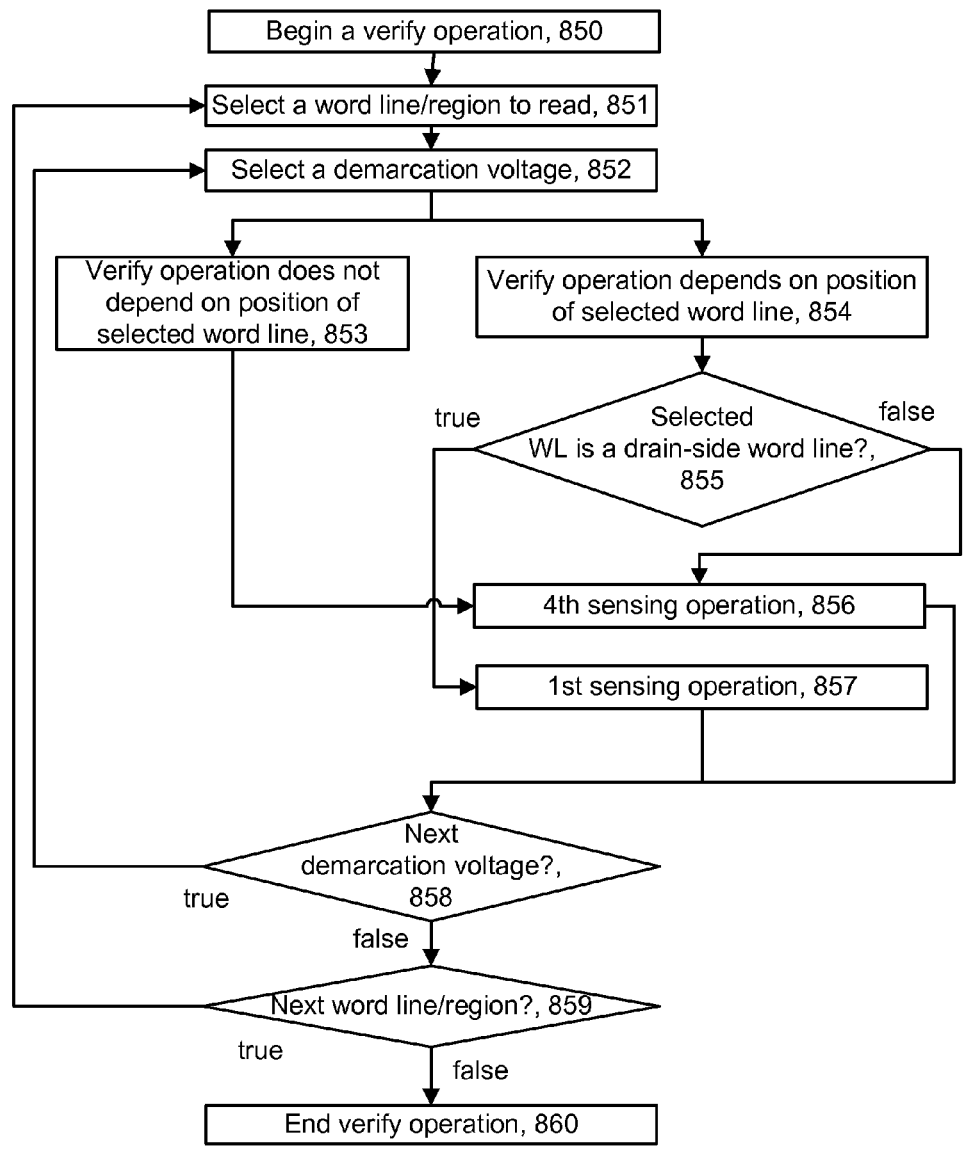
FIG. 8D depicts a verify operation which is an example implementation of step 836 of FIG. 8C.

FIG. 8D depicts a verify operation which is an example implementation of step 836 of FIG. 8C. A verify operation begins at step 850. Step 851 selects a word line and region to read. Step 852 sets a demarcation voltage, e.g., VvA. Subsequently, one of two paths can be followed. In a first path, at step 853, the verify operation does not depend on the position of the selected word line. This path can be chosen for similar reasons as discussed in connection with 813 in FIG. 8B. Step 856 involves performing a fourth sensing operation, discussed, e.g., in connection with FIG. 9C and FIG. 13A-13H.

A decision step 858 determines whether there is a next demarcation voltage to apply. If decision step 858 is true, a next demarcation voltage, e.g., VvB, is applied at step 852. If decision step 858 is false, a decision step 859 determines whether there is a next word line or region to read. If decision step 859 is false, step 860 represents the end of the verify operation. If decision step 859 is true, a next word line or region to read is selected at step 851.

In a second path after step 852, at step 853, the verify operation depends on the position of the selected word line (step 854). This path can be chosen for similar reasons as discussed in connection with 815 in FIG. 8B. A decision step 855 determines whether the selected word line is a drain-side word line in the set of word lines. If this decision step is true, step 857 involves performing the first sensing operation, as in step 814 of FIG. 8B. If this decision step is false, e.g., the selected word line is source-side or middle a word line, step 856 involves performing the fourth sensing operation.

In one example, the source-side word line is in a subset of the data word lines which is adjacent to the source-side of the set of word line, where the subset includes, e.g., no more than 10-20% of the set of data word lines. A drain-side word line is in a subset of the data word lines which is adjacent to the drain-side of the set of word line, where the subset includes, e.g., no more than 10-20% of the set of data word lines. A middle word line includes the remaining middle data word lines, e.g., 60-80% of the set of data word lines.

Another option is to perform the first sensing operation regardless of the position of the selected word line, then transition to using the decision step 855 which selects between the first and fourth sensing operations, after the memory device has experienced a certain amount of read stress, e.g., as measured by a count of read operations, program-erase cycles or other metric. This can save time since the fourth sensing operation is longer than the first sensing operation due to SGD_unsel remaining in a conductive state after the word line voltages ramp down.

The decision step 858, discussed previously, is then reached.

In this approach, the same sensing operation (e.g., the fourth sensing operation) is used for the case where the verify operation does not depend on the position of the selected word line, and the case where the verify operation depends on the position of the selected word line but the selected word line is not among a predefined subset of the word lines.

Figure 9A:
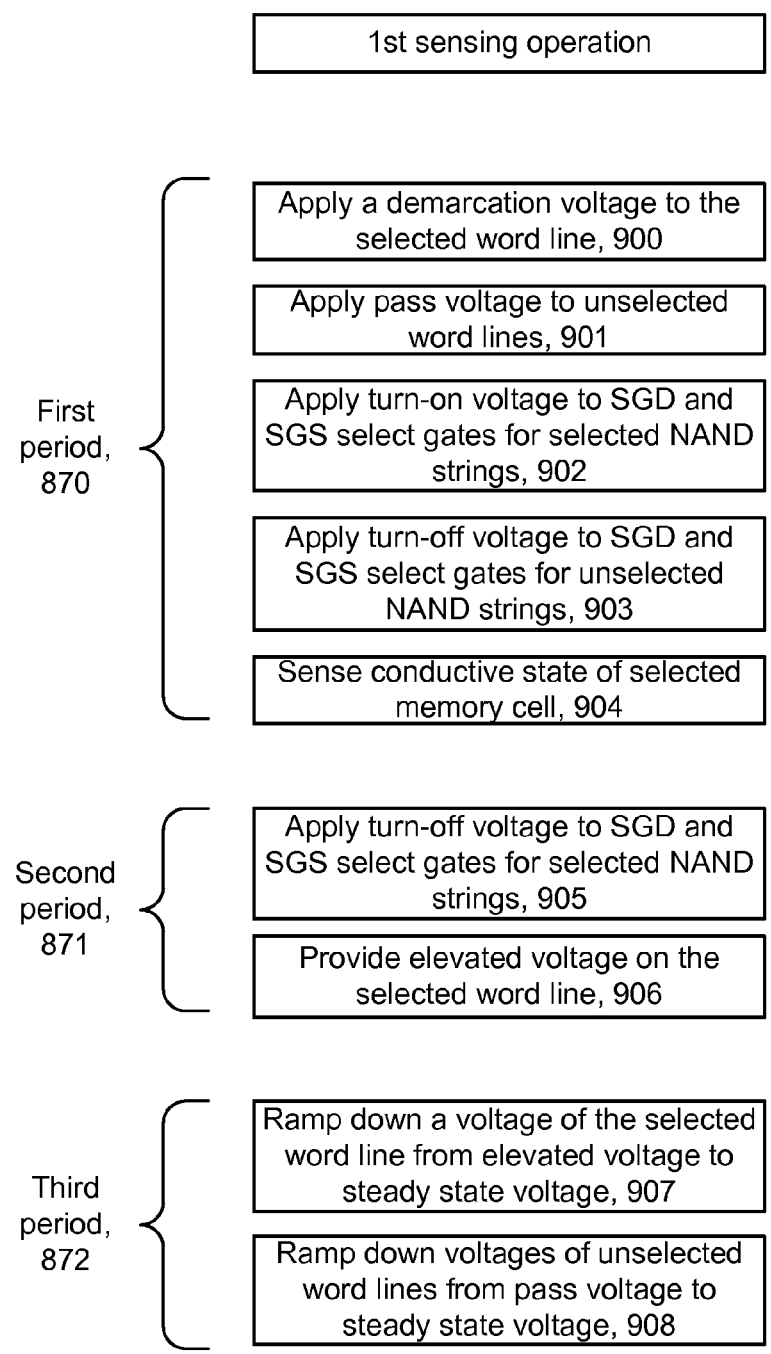
FIG. 9A depicts an example of the first sensing operation of step 814 in FIG. 8B and step 857 in FIG. 8D.

FIG. 9A depicts an example of the first sensing operation of step 814 in FIG. 8B and step 857 in FIG. 8D. Referring also to FIG. 11A-11H, this sensing operation includes first, second and third periods 870, 871 and 872, respectively, corresponding to the time periods t0-t9, t9-t10 and t10-t11, respectively. The first period includes applying a demarcation voltage to the selected word line (step 900), applying a pass voltage to unselected word lines (step 901), applying a turn-on voltage to SGD and SGS select gates for selected NAND strings (step 902), applying a turn-off voltage to SGD and SGS select gates for unselected NAND strings (step 903) and sensing a conductive state of selected memory cells (step 904). The second period includes applying a turn-off voltage to SGD and SGS select gates for selected NAND strings (step 905) and providing an elevated voltage on the selected word line (step 906). A third period includes ramping down a voltage of the selected word line from the elevated voltage to a respective steady state voltage (step 907), and ramping down the voltages of the unselected word lines from the pass voltage to a respective steady state voltage (step 908).

For example, the elevated voltage on the selected word line may be equal to, or similar to, the pass voltage of the unselected word lines. The elevated voltage may be within a defined range of the pass voltage, such as a range of +/−10% or +/−20%. By ramping down the voltages of the selected and unselected word lines from a similar starting level to a similar final level, an equal amount of capacitive coupling to is provided from the word lines to regions of the channel which are directly adjacent to the word lines. This avoids a channel gradient which can cause read disturb. Moreover, by applying a turn-off voltage to the SGD and SGS select gates for selected NAND strings before ramping down the voltages of the word lines, the voltage in the channel is floated so that a uniform negative voltage can be maintained in the channel. That is, the channel is cutoff from the bit line by the SGD select gate being non-conductive and from the source line by the SGS select gate being non-conductive. The respective steady state voltages may be 0 V, for instance.

The turn-on voltages of the select gate are voltages which are sufficiently high to provide the select gates in a conductive state, and the turn-off voltages of the select gate are voltages which are sufficiently low to provide the select gates in a non-conductive state. Generally, a transistor such as a select gate or memory cell will be in a conductive state when the control gate voltage exceeds the sum of the threshold voltage and the source or drain voltage. A SGD select gate will typically be in a conductive state when the control gate voltage exceeds the sum of the Vth and Vbl or in a non-conductive state otherwise. A SGS select gate will typically be in a conductive state when the control gate voltage exceeds the sum of the Vth and Vsl or in a non-conductive state otherwise.

The ramp down of a voltage may involve a request from a controller for the voltage to step down or decrease more gradually. Due to the time constant of a word line or select gate line, the voltage will typically decrease exponentially. The applying of a turn-on voltage is the same as ramping up a voltage and the applying of a turn-off voltage is the same as ramping down a voltage.

Figure 9B:
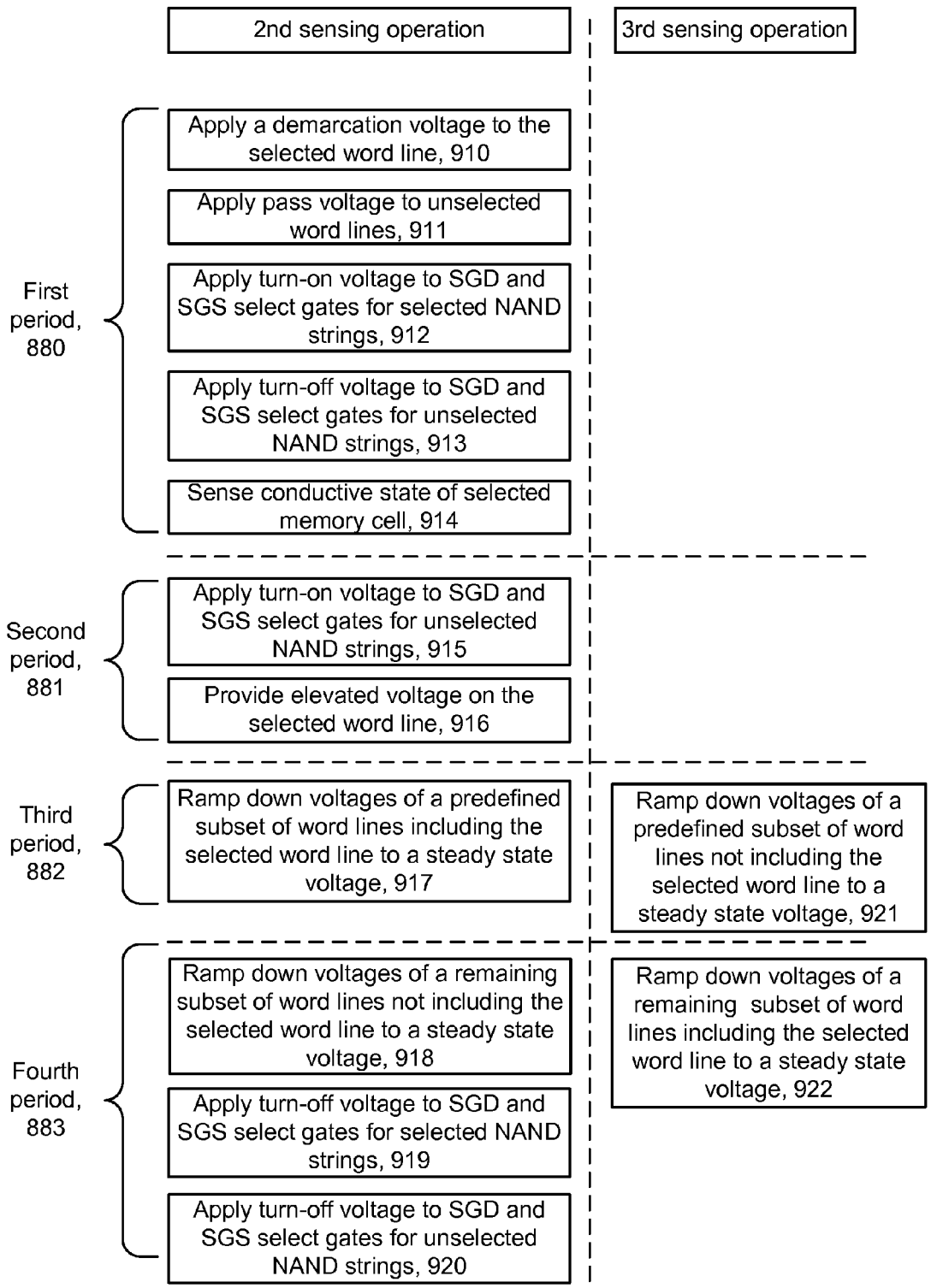
FIG. 9B depicts an example of the second sensing operation of step 818 in FIG. 8B and the third sensing operation of step 817 in FIG. 8B.

FIG. 9B depicts an example of the second sensing operation of step 818 in FIG. 8B and the third sensing operation of step 817 in FIG. 8B. The second sensing operation is discussed first. Referring also to FIG. 12A-12H, this sensing operation includes a first period 880 corresponding to the time period t0-t9, a second period 881 corresponding to the time period t9-t10, a third period 882 corresponding to the time period t10-t11, and a fourth time period 883 corresponding to the time period t11-t12.

The first period includes applying a demarcation voltage to the selected word line (step 910), applying a pass voltage to unselected word lines (step 911), applying a turn-on voltage to SGD and SGS select gates for selected NAND strings (step 912), applying a turn-off voltage to SGD and SGS select gates for unselected NAND strings (step 913) and sensing a conductive state of selected memory cells (step 914). The second period includes applying a turn-on voltage to SGD and SGS select gates for unselected NAND strings (step 915) and providing an elevated voltage on the selected word line (step 916). A third period includes ramping down voltages of a predefined subset of word lines, including the selected word line, to respective steady state voltages (step 917). See plot 1200a in FIG. 12A and plot 1201a in FIG. 12B at t10. A fourth period includes ramping down the voltages of a remaining subset of the word lines, not including the selected word line, to respective steady state voltages (step 918) (see plot 1201b in FIG. 12B at t11), applying a turn-off voltage to SGD and SGS select gates for selected NAND strings (step 919), and a applying a turn-off voltage to SGD and SGS select gates for the unselected NAND strings (step 920). Step 918 can occur at the same time as steps 919 and 920 or no later than a time at which steps 919 and 920 are performed. Step 918 occurs after step 917.

The third sensing operation is now discussed. The first and second periods are the same as in the second sensing operation and steps 919 and 920 are repeated from the fourth period. In the third period, step 921 is used in place of step 917. In the fourth period, step 922 is used in place of step 918. Step 921 includes ramping down the voltages of a predefined subset of word lines, not including the selected word line, to respective steady state voltages. See plot 1201a in FIG. 12B at t10. Step 922 includes ramping down the voltages of a remaining subset of word lines, including the selected word line, to respective steady state voltages. See plot 1200b in FIG. 12A and plot 1201b in FIG. 12B at t11. Thus, the selected word line is among the predefined subset of word lines in the second sensing operation and is ramped down at t10, and is among the remaining subset of word lines in the third sensing operation and is ramped down after t10 and no later than t11.

Figure 9C:
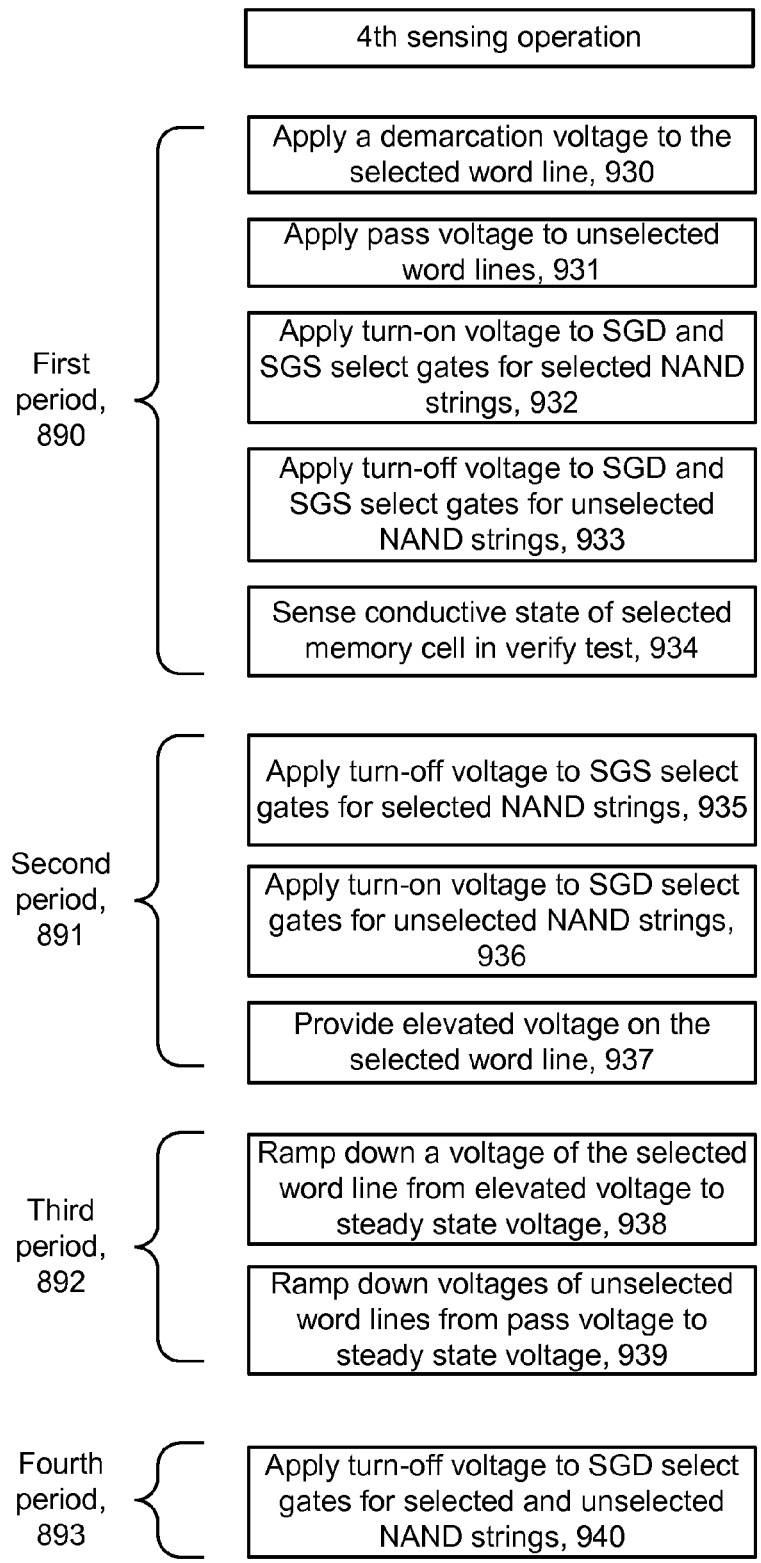
FIG. 9C depicts an example of the fourth sensing operation of step 856 in FIG. 8D.

FIG. 9C depicts an example of the fourth sensing operation of step 856 in FIG. 8D. Referring also to FIG. 13A-13H, this sensing operation includes first, second, third and fourth time periods 890, 891, 892 and 893, respectively, corresponding to the time periods t0-t9, t9-t10, t10-t11 and t11-t12, respectively. The first period includes applying a demarcation voltage to the selected word line (step 930), applying a pass voltage to unselected word lines (step 931), applying a turn-on voltage to SGD and SGS select gates for selected NAND strings (step 932), applying a turn-off voltage to SGD and SGS select gates for unselected NAND strings (step 933) and sensing a conductive state of selected memory cells in a verify test (step 934). The second period includes applying a turn-off voltage to SGS (but not SGD) select gates for selected NAND strings (step 935), applying a turn-on voltage to the SGD and SGS select gates for the unselected NAND strings (step 936), and providing an elevated voltage on the selected word line (step 937). A third period includes ramping down a voltage of the selected word line from the elevated voltage to a respective steady state voltage (step 938), and ramping down the voltages of the unselected word lines from the pass voltage to a respective steady state voltage (step 939). A fourth period includes applying a turn-off voltage to the SGD select gates for the selected and unselected NAND strings (step 940). The SGS select gates for the unselected NAND strings may be provided at 0 V throughout the four periods, in one approach.

Figure 9D:
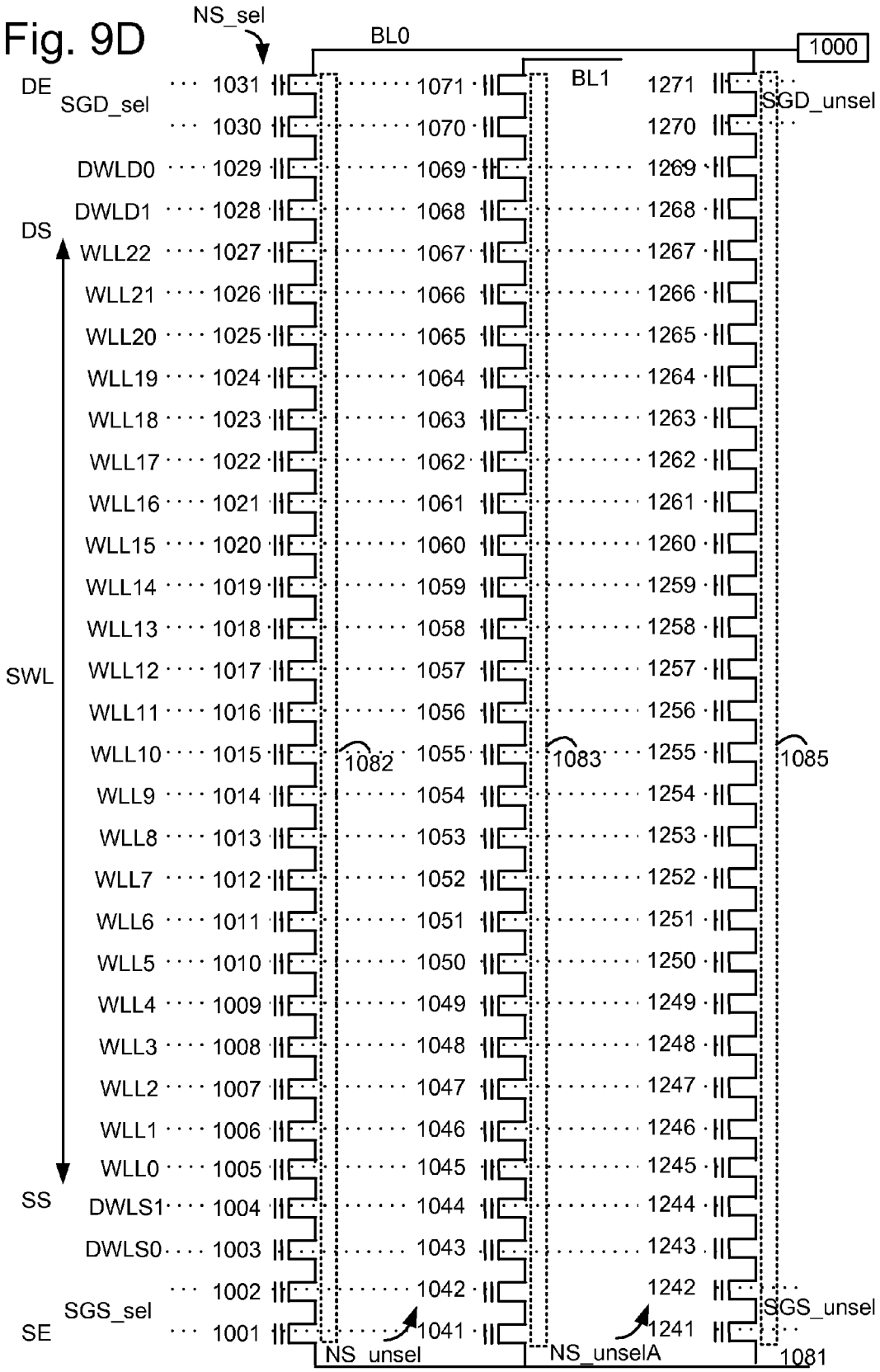
FIG. 9D depicts a circuit diagram of example NAND strings in a memory device which is similar to that of FIG. 4C, where data word line layers WLL0-WLL22 are provided.

FIG. 9D depicts a circuit diagram of example NAND strings in a memory device which is similar to that of FIG. 4C, where data word line layers WLL0-WLL22 are provided. This figure provides an example configuration and notation which facilitates the discussion of the following figures. DS is a drain-side of a set of data word lines (SWL), SS is a source-side of the set of data word lines, DE is a drain end of the NAND strings and SE is a source end of the NAND strings.

This example includes a NAND string NS_sel which is selected for reading or programming operations, a NAND string NS_unsel which is not selected and is in a common region of the block with NS_sel (e.g., in a selected region or sub-block), and a NAND string NS_unselA which is not selected and is in another region of the block (e.g., in an unselected region or sub-block). For example, NS_sel may be provided by the memory hole 410 in the region 426 of FIG. 4B, NS_unsel may be provided by the memory hole 411 in the region 426, and NS_unselA may be provided by the memory hole 414 in the region 427. Moreover, NS_sel and NS_unselA are both connected at their drain ends to BL0, and NS_unsel is connected at its drain end to BL1, consistent with FIG. 4B.

The NAND strings in one region have their SGD select gates commonly driven by a SGD_sel line (a selected drain-side select gate line) and their SGS select gates commonly driven by a SGS_sel line (a selected source-side select gate line). NS_unselA has the same word line voltages as the other NAND strings but an independent SGD line, SGD_unsel and SGS line, SGS_unsel.

Further, each NAND string includes two SGD select gates which have their control gates connected so they are commonly driven, and two SGS select gates which have their control gates connected so they are commonly driven.

SGS_sel is connected to the SGS select gates 1001 and 1002 in NS_sel and to SGS select gates 1041 and 1042 in NS_unsel. Source-side dummy word lines DWLS0 and DWLS1 are connected to dummy memory cells 1003 and 1004, respectively, in NS_sel, to dummy memory cells 1043 and 1044, respectively, in NS_unsel and to dummy memory cells 1243 and 1244, respectively, in NS_unselA. Word lines for the data-storing memory cells, WLL0-WLL22, are connected to data-storing memory cells 1005-1027, respectively, in NS_sel, to data-storing memory cells 1045-1067, respectively, in NS_unsel, and to data-storing memory cells 1245-1267, respectively, in NS_unselA. Each word line is connected to memory cells in the selected and unselected NAND strings. Drain-side dummy word lines DWLD1 and DWLD0 are connected to dummy memory cells 1028 and 1029, respectively, in NS_sel, to dummy memory cells 1068 and 1069, respectively, in NS_unsel and to dummy memory cells 1268 and 1269, respectively, in NS_unselA.

SGD_sel is connected to the SGD select gates 1030 and 1031, respectively, in NS_sel and to the SGD select gates 1070 and 1071, respectively, in NS_unsel. SGD_unsel is connected to the SGD select gates 1270 and 1271, respectively, in NS_selA. SGS_sel is an example of a selected source-side select gate line which is connected to the source-side select gate (1001, 1002) of a selected NAND string (NS_sel). SGS_unsel is an example of an unselected source-side select gate line which is connected to the source-side select gate (1241, 1242) of an unselected NAND string (NS_unselA). Similarly, SGD_sel is an example of a selected drain-side select gate line which is connected to the drain-side select gate (1030, 1031) of a selected NAND string (NS_sel). SGD_unsel is an example of an unselected drain-side select gate line which is connected to the drain-side select gate (1270, 1271) of an unselected NAND string (NS_unselA).

In an example which is consistent with FIGS. 14A-14D and FIGS. 15C-15E, WLL1 is a selected word line and WLL0 and WLL2-WLL22 are unselected word lines. In this case, the memory cell 1006 is a selected memory cell and the other data memory cells in NS_sel, NS_unsel and NS_selA are unselected. In an example which is consistent with FIGS. 15A and 15B, WLL2 is a selected word line and WLL0, WLL1 and WLL3-WLL22 are unselected word lines. In this case, the memory cell 1007 is a selected memory cell and the other data memory cells in NS_sel, NS_unsel and NS_unselA are unselected.

As mentioned, each NAND string can have one or more SGD select gates and zero or more dummy memory cells at the drain-side and source-side of a NAND string.

A current in NS_sel is sensed by sensing circuitry 1000 via BL0 which is at a voltage, Vbl. NS_sel has a channel 1082, NS_unsel has a channel 1083 and NS_unselA has a channel 1085. Other sensing circuitry is connected to BL1. The sensing circuitry 1000 is used to sense NS_sel during a sensing operation. A source line 1081 is connected to source-ends of the NAND strings. Voltage drivers can be used to provide voltages on the control lines (e.g., word lines, select gate lines, bit line and source line).

FIG. 10A depicts a plot of a selected word line voltage versus time in a comparative sensing operation. The horizontal times scales of FIG. 10A-10H are time-aligned. From t0-t3, a steady state voltage, Vwl_sel_ss is applied. Subsequently, one or more demarcation voltages are provided, e.g., Vwl_sela, Vwl_selb and Vwl_selc. WL_sel is ramped down to Vwl_sel ss at t9. Sensing in the select NAND strings can occur at t4, t6 and t8 during the demarcation voltages of Vwl_sela, Vwl_selb and Vwl_selc, respectively.

FIG. 10B depicts a plot of an unselected word line voltage versus time in the comparative sensing operation. A pass voltage, Vpass, is provided from t0-t10, and ramped down at t9 to a respective steady state level, Vwl_unsel_ss.

FIG. 10C depicts a plot of a selected SGD select gate voltage versus time in the comparative sensing operation. A respective turn-off voltage, Vsgd_sel_off, is applied from t0-t1, a respective turn-on voltage, Vsgd_sel_on, is applied from t1-t9, and the respective turn-off voltage is applied starting at t9.

FIG. 10D depicts a selected SGS select gate voltage versus time in the comparative sensing operation. A respective turn-off voltage, Vsgs_sel_off, is applied from t0-t1, a respective turn-on voltage, Vsgs_sel_on, is applied from t1-t9, and the respective turn-off voltage is applied starting at t9.

FIG. 10E depicts a plot of an unselected SGD select gate voltage versus time in the comparative sensing operation. A turn off voltage, Vsgd_unsel_off, may be applied the entire time.

FIG. 10F depicts an unselected SGS select gate voltage versus time in the comparative sensing operation. A turn off voltage, Vsgs_unsel_off, may be applied the entire time.

FIG. 10G depicts a plot of a bit line voltage versus time in the comparative sensing operation. A steady state voltage, Vbl_ss, is applied from t0-t1 and t9-t10, and a sensing voltage, Vbl_sense, is applied from t1-t9. During sensing for each demarcation voltage, Vbl may remain relatively steady or may decay during sensing of a selected NAND string. The case with a bit line decay is depicted by plots 990a, 990b and 990c.

FIG. 10H depicts a plot of a source line voltage versus time in the comparative sensing operation. A steady state voltage, VSL_ss, is applied from t0-t1 and t9-t10, and a sense voltage, VSL_sense, is applied from t1-t9.

As mentioned, read disturb is most likely for the memory cells on WLn−1 when WLn is close to the source-side of a set of word line, and for the memory cells on WLn+1 when WLn is close to the drain-side of a set of word line. When WL_unsel ramps down from Vpass (e.g., 8 V) to Vwl_unsel_ss (e.g., 0 V), WL_sel ramps down from a demarcation voltage, Vwl_selc to Vwl_sel ss. Since the demarcation voltage is typically lower than Vpass, when Vwl_sel and Vwl_unsel ramp down at the same time, the channel region of WLn can be negatively coupled by the adjacent unselected word lines to a much lower voltage than Vwl_sl_ss for a short period of time. Tests have shown that a lower Vwl_sel before the ramp down makes read disturb worse. Further, the channel potential gradient between WLn and the adjacent word lines could be very high if the memory cell of WLn is at high Vth state and the memory cell of the adjacent WL is at low Vth state. This, in turn, causes HEI type of read disturb on the memory cells of the adjacent word lines.

FIG. 11A depicts a plot of a selected word line voltage versus time in the first sensing operation of FIG. 9A. The horizontal times scales of FIG. 11A-11H are time-aligned. From t0-t3, a steady state voltage, Vwl_sel_ss, such as 0 V is applied. Subsequently, one or more demarcation voltages are provided. For example, Vwl_sela, e.g., VrEr/A or VvA (an example is 1 V), is provided from t3-t5, Vwl_selb, e.g., VrA/B or VvB (an example is 3 V), is provided from t5-t7, and Vwl_selc, e.g., VrB/C or VvC (an example is 5 V), is provided from t7-t9. An elevated voltage, Vwl_el, is provided from t9-t10. WL_sel is ramped down from Vwl_el to Vwl_sel ss from t10-t11 and remains at Vwl_sel_ss from t11-t12. For example, Vwl_el can be equal to or similar to Vpass, e.g., 7-9 V. Sensing in the select NAND strings can occur at t4, t6 and t8 during the demarcation voltages of Vwl_sela, Vwl_selb and Vwl_selc, respectively. See also the discussion of the bit line voltages of FIG. 11G. In another example, only one demarcation voltage is applied.

FIG. 11B depicts a plot of an unselected word line voltage versus time in the first sensing operation of FIG. 9A. A pass voltage, Vpass, is provided from t0-t10, ramped down concurrently with the ramp down of WL_sel at t10-t11, and provided at a respective steady state level, Vwl_unsel_ss, e.g., 0 V, from t11-t12.

FIG. 11C depicts a plot of a selected SGD select gate voltage versus time in the first sensing operation of FIG. 9A. A respective turn-off voltage, Vsgd_sel_off, e.g., 0 V, is applied from t0-t1, a respective turn-on voltage, Vsgd_sel_on, e.g., 2-3 V, is applied from t1-t9, and the respective turn-off voltage is applied starting at t9.

FIG. 11D depicts a selected SGS select gate voltage versus time in the first sensing operation of FIG. 9A. A respective turn-off voltage, Vsgs_sel_off, e.g., 0 V, is applied from t0-t1, a respective turn-on voltage, Vsgs_sel_on, e.g., 2-3 V, is applied from t1-t9, and the respective turn-off voltage is applied starting at t9.

FIG. 11E depicts a plot of an unselected SGD select gate voltage versus time in the first sensing operation of FIG. 9A. A turn off voltage, Vsgd_unsel_off, e.g., 0 V, may be applied the entire time, from t0-t12.

FIG. 11F depicts an unselected SGS select gate voltage versus time in the first sensing operation of FIG. 9A. A turn off voltage, Vsgs_unsel_off, e.g., 0 V, may be applied the entire time, from t0-t12.

FIG. 11G depicts a plot of a bit line voltage versus time in the first sensing operation of FIG. 9A. A steady state voltage, Vbl_ss, e.g., 0 V, is applied from t0-t1 and t9-t12, and a sensing voltage, Vbl_sense, e.g., 2-3 V, is applied from t1-t9. During sensing for each demarcation voltage, Vbl may remain relatively steady or may decay during sensing of a selected NAND string. Recall that each bit line may be connected to a selected NAND string and one or more unselected NAND strings. The case with a bit line decay is depicted by plots 1100a, 1100b and 1100c. If Vbl decays below a specified trip level, Vbl_trip, the selected NAND string is considered to be in a conductive state and the Vth of the selected memory cell is below the demarcation voltage. If Vbl does not decay below Vbl_trip, the selected NAND string is considered to be in a non-conductive state and the Vth of the selected memory cell is equal to or above the demarcation voltage.

FIG. 11H depicts a plot of a source line voltage versus time in the first sensing operation of FIG. 9A. A steady state voltage, VSL_ss, e.g., 0 V, is applied from t0-t1 and t9-t12, and a sense voltage, VSL_sense, e.g., 2-3 V, is applied from t1-t9.

This approach reduces read disturb by ramping down the selected SGD/SGS select gates to make sure they are non-conductive before all data word lines ramp down. This ensures that the channel is floating so that the channel potential will follow the gate voltage when ramping down regardless of the Vth of the memory cell. The channel voltage is floated so that a uniform negative voltage can be provided in the channel.

Further, Vwl_sel is ramped up to Vpass so that all word lines are ramped down at the same time (t10) from Vpass to 0 V, for instance. This ensures that the channel potential gradient throughout all word lines, particularly the channel portions associated with WLn+1, WLn and WLn−1, is as small as possible. Further, the SGD/SGS select gates of the unselected NAND strings remain non-conductive to ensure that the HEI type of read disturb does not occur in the unselected NAND strings.

See also FIGS. 14A and 14B. However, since the select gates of the selected NAND string are non-conductive during the ramp down of the word line voltages, it is possible for electrons to be trapped in the channel, which can reduce boosting if the channel is to be inhibited during a next programming voltage. This is not a concern during a read operation. As a result, the first sensing operation is more suitable for a read operation.

The approach of FIG. 11A-11H can also be used when performing a verify operation for a word line which among drain-side word lines, as discussed also in step 855 of FIG. 8D.

The transitions of the voltages of Vsgd_sel, Vsgs_sel, Vbl and Vsl at t9 is shown as being concurrent with the step up in Vwl_sel but this is not required. For example, these transitions can occur during Vwl_el. Moreover, the transitions in the select gates need not be concurrent with the transitions in the bit lines at t9.

FIG. 12A depicts a plot of a selected word line voltage versus time in the second and third sensing operations of FIG. 9B. The horizontal times scales of FIG. 12A-12H are time-aligned. From t043, a steady state voltage, Vwl_sel_ss, is applied. As in FIG. 11A, the demarcation voltages Vwl_sela, Vwl_selb and Vwl_selc are provided from t3-t5, t5-t7 and t7-t9, respectively, the elevated voltage, Vwl_el, and WL_sel is ramped down from Vwl_el to Vwl_sel_ss from t10-t11. Sensing in the select NAND strings can occur at t4, t6 and t8. A plot 1200a represents the case of ramping down the selected word line with at least one other unselected word line in a predefined subset of word lines. A plot 1200b represents the case of ramping down the selected word line with at least one other unselected word line in a remaining subset of word lines.

FIG. 12B depicts a plot of an unselected word line voltage versus time in the second and third sensing operations of FIG. 9B. As in FIG. 11B, Vpass, is provided from t0-t10, ramped down concurrently with the ramp down of WL_sel at t10-t11, and provided at a respective steady state level, Vwl_unsel_ss from t11-t12. A plot 1201a represents the case of ramping down unselected word lines in a predefined subset of word lines. A plot 1201b represents the case of ramping down unselected word lines in a remaining subset of word lines.

FIG. 12C depicts a plot of a selected SGD select gate voltage versus time in the second and third sensing operations of FIG. 9B. A respective turn-off voltage, Vsgd_sel_off, is applied from t0-t1, and a respective turn-on voltage, Vsgd_sel_on, is applied starting at t1. The turn-off voltage is applied again at t11.

FIG. 12D depicts a selected SGS select gate voltage versus time in the second and third sensing operations of FIG. 9B. A respective turn-off voltage, Vsgs_sel_off, is applied from t0-t1, and a respective turn-on voltage, Vsgs_sel_on, is applied starting at t1. The turn-off voltage is applied again starting at t11. The voltages of the SGD and SGS select gates for the selected NAND strings can be ramped down concurrently in the second and third sensing operations.

FIG. 12E depicts a plot of an unselected SGD select gate voltage versus time in the second and third sensing operations of FIG. 9B. For the second sensing operation, a respective turn-off voltage, Vsgd_unsel_off, is applied from t0-t9, a respective turn-on voltage, Vsgd_unsel_on, is applied from t9-t11, and the respective turn-off voltage is applied again starting at t11.

FIG. 12F depicts an unselected SGS select gate voltage versus time in the second and third sensing operations of FIG. 9B. Aa respective turn-off voltage, Vsgs_unsel_off, is applied from t0-t9, a respective turn-on voltage, Vsgs_unsel_on, is applied from t9-t11, and the respective turn-off voltage is applied again starting at t11.

A respective turn-off voltage, Vsgs_unsel_off, is applied from t0-t9, a respective turn-on voltage, Vsgs_unsel_on, is applied from t9-t11, and the respective turn-off voltage is applied again starting at t11.

FIG. 12G depicts a plot of a bit line voltage versus time in the second and third sensing operations of FIG. 9B. A steady state voltage, Vbl_ss, is applied from t0-t1 and t9-t12, and a sensing voltage, Vbl_sense, is applied from t1-t9. As discussed in FIG. 11G, the case with a bit line decay is depicted by plots 1210a, 1210b and 1210c.

FIG. 12H depicts a plot of a source line voltage versus time in the second and third sensing operations of FIG. 9B. A steady state voltage, VSL_ss, is applied from t0-t1 and t9-t12, and a sense voltage, VSL_sense is applied from t1-t9.

These sensing operations have an advantage in reducing read disturb when the selected word line is close to the edge of the plurality of word lines, such as discussed in connection with FIG. 15A-15E.

Since the disturb is most severe at the edge word lines, these sensing operations ramp down the voltages of the edge word lines, which are in a predefined subset of word lines, earlier than for the middle word lines, which are in a remaining subset of word lines, and the select gates, so that the disturb time on the edge word lines is shortened and hence read disturb is reduced. In the example of FIG. 15D, the predefined subset of word lines includes WLL0, WLL1, WLL21 and WLL22, where WLL0 and WLL1 are adjacent source-side word lines and WLL21 and WLL22 are adjacent drain-side word lines. The remaining subset of word lines includes WLL2-WLL20. In the example of FIG. 15E, the predefined subset of word lines includes WLL0, WLL2, WLL20 and WLL22, where WLL0 and WLL2 are non-adjacent source-side word lines and WLL20 and WLL22 are non-adjacent drain-side word lines. The remaining subset of word lines includes WLL1, WLL3-WLL19 and WLL21.

In these sensing operations, the time span of the disturb is reduced because the capacitance of the potential well in the channel is reduced, e.g., to the associated channel length which encompasses just one or two word lines, for instance. The smaller capacitance allows the potential well to be filled relatively quickly, reducing the time span of the disturb.

The transitions of the voltages of Vsgd_unsel, Vsgs_unsel, Vbl and Vsl at t9 is shown as being concurrent with the step up in Vwl_sel but this is not required. For example, these transitions can occur during Vwl_el. Moreover, the transitions in the select gates need not be concurrent with the transitions in the bit lines at t9.

The concurrent ramping down of the word line voltages in the predefined subset occurs relatively sooner compared to the ramping down of the word line voltages of the remaining subset. As mentioned, the timing of the ramp down of the selected word line depends on whether it is part of the predefined subset of word lines or the remaining subset of word lines.

FIG. 13A depicts a plot of a selected word line voltage versus time in the fourth sensing operation of FIG. 9C. The horizontal times scales of FIG. 13A-13H are time-aligned. From t0-t3, a steady state voltage, Vwl_sel_ss, is applied. As in FIG. 11A, the demarcation voltages Vwl_sela, Vwl_selb and Vwl_selc are provided from t3-t5, t5-t7 and t7-t9, respectively, the elevated voltage, Vwl_el, and WL_sel is ramped down from Vwl_el to Vwl_sel_ss from t10-t11. Sensing in the select NAND strings can occur at t4, t6 and t8.

FIG. 13B depicts a plot of an unselected word line voltage versus time in the fourth sensing operation of FIG. 9C. As in FIG. 11B, Vpass, is provided from t0-t10, ramped down concurrently with the ramp down of WL_sel at t10-t11, and provided at a respective steady state level, Vwl_unsel_ss from t11-t12.

FIG. 13C depicts a plot of a selected SGD select gate voltage versus time in the fourth sensing operation of FIG. 9C. A respective turn-off voltage, Vsgd_sel_off, is applied from t0-t1, a respective turn-on voltage, Vsgd_sel_on, is applied starting at t1, and the turn-off voltage is applied again starting at t11 after the ramp down of the word line voltages.

FIG. 13D depicts a selected SGS select gate voltage versus time in the fourth sensing operation of FIG. 9C. A respective turn-off voltage, Vsgs_sel_off, is applied from t0-t1, a respective turn-on voltage, Vsgs_sel_on, is applied starting at t1, and the turn-off voltage is applied again starting at t9, before the ramp down of the word line voltages.

FIG. 13E depicts a plot of an unselected SGD select gate voltage versus time in the fourth sensing operation of FIG. 9C. A respective turn-off voltage, Vsgd_unsel_off, is applied from t0-t9, a respective turn-on voltage, Vsgd_unsel_on, is applied from t9-t11, and the respective turn-off voltage is applied again starting at t11.

FIG. 13F depicts an unselected SGS select gate voltage versus time in the fourth sensing operation of FIG. 9C. A turn off voltage, Vsgd_unsel_off, e.g., 0 V, may be applied the entire time, from t0-t12.

FIG. 13G depicts a plot of a bit line voltage versus time in the fourth sensing operation of FIG. 9C. A steady state voltage, Vbl_ss, is applied from t0-t1 and t9-t12, and a sensing voltage, Vbl_sense, is applied from t1-t9. As discussed in FIG. 11G, the case with a bit line decay is depicted by plots 1300a, 1300b and 1300c.

FIG. 13H depicts a plot of a source line voltage versus time in the fourth sensing operation of FIG. 9C. A steady state voltage, VSL_ss, is applied from t0-t1 and t9-t12, and a sense voltage, VSL_sense is applied from t1-t9.

For a programming operation, the memory cells of a block are initially all erased. The programming operation proceeds one word line at a time, starting from the first word line. Hence, the verify operations, which are part of the programming operation, are also done one word line at a time. In terms of the severity of the HEI type of read disturb, the program verify operation is different from the read operation which is done when the full bock is already programmed. One difference is that the number of verify operations is relatively small depending on several programming-related parameters. For example, the number of verify operations of FIG. 7C is minimized based on the expected programming progress of the memory cells during the programming operation. Second, even when the number of verify operations is relatively large, the memory cells of the word lines above (on the drain-side of) the selected WL are all erased. As a result, HEI type of read disturb is not a concern. Accordingly, the voltage of the SGD select gate can be ramped down later than the voltage of the data word lines. This avoids an excessive amount of residue electrons in the channel, compared to the approach of FIG. 10A-10H which might harm the channel boosting during the subsequent program pulse. The voltage of the SGS select gate continues to ramp down earlier than the data word lines since the source-side edge word lines could still get disturbed when most of the data word lines are programmed.

In one approach, as depicted in FIG. 8D, the waveforms of FIG. 13A-13H are used when the selected word line is among source-side or middle word lines in a set of word lines, and the waveforms of FIG. 11A-11H are used when the selected word line is among drain-side word lines. During a verify operation involving a selected word line among the upper (drain-side) word lines, the memory cells of the word lines below (on the source-side of) the selected word line are randomly programmed to different data states, and the memory cells above (on the drain-side of) the selected word line are in the erased state. This could cause read disturb when stressing the drain-side word lines during reading. To address this, the SGD waveforms can ramp down earlier than the data word lines to improve read disturb, just as depicted for the proposed waveform of the read operation of FIG. 11C in the first sensing operation.

In the examples of FIGS. 14A-14D and FIGS. 15C-15E, WLL1 is the selected word line. In the examples of FIGS. 15A and 15B, WLL2 is the selected word line. The following figures are consistent with FIG. 9D.

The transitions of the voltages of Vsgs_sel, Vsgd_unsel, Vbl and Vsl at t9 is shown as being concurrent with the step up in Vwl_sel but this is not required. For example, these transitions can occur during Vwl_el.

FIG. 14A depicts a plot of a channel voltage (Vch) of a NAND string versus channel position, in a physical model of a NAND string in which a channel portion under a selected word line is non-conductive. This situation may occur during sensing, e.g., while a demarcation voltage is applied, such as from t3-t8 in FIG. 11A-13H. In the example, the Vth of a memory cell (e.g., 5V) exceeds the control gate voltage (e.g., 3 V), which is an example demarcation voltage, so that a channel portion 1403 is non-conductive. For the other channel portions, the control gate voltage exceeds the Vth of the associated transistor so that the channel portions 1400-1402 and 1404-1406 are conductive. The channel portions of the transistors on the source-side of the cutoff channel portion can therefore receive a voltage Vsl and the channel portions of the transistors on the drain-side of the cutoff channel portion can therefore receive a voltage Vbl.

Specifically, the channel position depicts a channel portion 1400 which is directly under the SGS lines and the SGS select gates, a channel portion 1401 which is directly under DWLS0 and DWLS1 and the associated dummy memory cells, channel portions 1402, 1403 and 1404 which are directly under WLL0, WLL1 and WLL2, respectively, and the associated memory cells, a channel portion 1405 which is directly under WLL3-DWLD0, and a channel portion 1406 which is directly under the SGD line and the associated select gates. The range of WLL3-DWLD0 includes WLL3-WLL22 and the associated memory cells, and DWLD0 and DWLD1 and the associated dummy memory cells. The lengths of the channel portions are not to scale as the region adjacent to WLL3-DWLD0 is shown compressed for conciseness.

Further, using example values, for the channel portion 1400, Vth=2 V and Vsgs=7 V, for the channel portions 1401 and 1402, Vth=0 V and Vwl_unsel=8 V, for the channel portion 1403, Vth=5 V and Vwl_sel=3 V, for the channel portions 1404 and 1405, Vth=5 V and Vwl_unsel=8 V, and for the channel portion 1406, Vth=2 V and Vsgd=7 V. Moreover, in this example, Vsl=0 V. This voltage is communicated to the channel portions 1400, 1401 and 1402 because the associated transistors are in a conductive state due to the control gate (word line) voltage exceeding the sum of the Vth and the source or drain voltage. For example, for the SGS select gates, Vsgs−Vth>Vsl since 7−2>0. For the DWLS0/DWLS1 dummy memory cells and for the WLL2-WLL22 data memory cells, Vwl_unsel−Vth>Vsl since 8−0>0. The DWLD0/DWLD1 dummy memory cells may be biased in the same way as the DWLS0/DWLS1 dummy memory cells, and the SGD select gates may be biased in the same way as the SGS select gates, in one approach. Also, Vbl=0 V may be applied at the drain-side of the NAND string.

However, for a memory cell connected to the selected word line, e.g., the associated channel portion will be non-conductive since Vwl_sel−Vth<Vsl (i.e., 3−5<0). Due to this non-conductive condition, the channel portion 1430 will have a voltage which is set based on the difference between Vwl_sel and Vth, or −2 V, rather than being set by Vsl or Vbl. This physical model of a NAND string is developed further in FIG. 14B to show how program disturb occurs.

FIG. 14B depicts a plot of Vch versus channel position when the word line voltages are ramped down concurrently with select gates, resulting in a large channel gradient which causes read disturb, consistent with the physical model of FIG. 14A. This situation may occur, e.g., at t9 in FIG. 10A-10H. This plot may follow the plot of FIG. 14A. FIG. 14B differs from FIG. 14A in the word line voltages associated with the channel portions 1402-1405. The source line voltage of 0 V remains in the channel portions 1400, 1401 and 1402 even as the associated control gate voltages are lowered to 0 V. The channel portion 1403 is reduced to −7 V, for example, due to the change in Vwl_sel to 0 V, particularly by the adjacent word lines, WLL0 and WLL2 of the selected word line WLL1. For comparison, with the reduction in Vwl_sel alone, a voltage of about −5 V would be expected in the channel portion 1403. The capacitive coupling from the adjacent word lines therefore results in a further −2 V reduction in the channel portion 1403. On the drain-side of WLL1, the channel portions 1404 and 1405 are reduced to −5 V, based on the relationship: Vwl_unsel−Vth (0−5=−5) for the associated transistors. Even if Vbl=0, this voltage is not passed to the channel portions 1404 and 1405 since they are non-conductive.

In the channel between WLL1 and WLL0, the transition from −7 V to 0 V represents a sharp gradient (line 1410) which results in the generation of electron-hole pairs as represented by an electron 1411e and a hole 1411h. The generated electrons can be injected into the charge trapping layers of the memory cell associated with WLL0, in this example, causing read disturb. In the channel between WLL1 and WLL2, the transition from −7 V to −5 V represents a small gradient which should not cause significant read disturb of the memory cell associated with WLL2.

The channel potential of FIG. 14B is seen temporarily since the holes tend to fill the potential well under WLL1, causing the channel potential to rise and equalize across the channel.

FIG. 14C depicts a plot of Vch versus channel position, in a physical model of a NAND string having trapped electrons in a sensing operation. As mentioned, after a selected NAND string is sensed, electrons may become trapped in the channel, and this can reduce the boosting potential if the NAND string is to be inhibited in the next program-verify iteration. This situation may occur, e.g., at t10 in FIG. 11A-11H. The trapped electrons result from the floating body structure of the 3D memory device in which the electrons cannot be absorbed into a substrate.

In this example, the SGS select gate is non-conductive since Vsgs−Vth=0−2=−2 V. Similarly, the SGD select gate is non-conductive since Vsgd−Vth=0−2=−2 V. Essentially, the lowered potentials under SGS and SGD present a barrier to the movement of the electrons toward the source- or drain-end, respectively, of the NAND string. The voltage for the channel portions on the drain-end may be a mirror image of the voltage of the channel portions on the source-end. In this situation, trapped or residue electrons, e.g., electron 1420e, are present in the channel.

FIG. 14D depicts a plot of Vch versus channel position, when a ramp down of the word line voltages occurs before the ramp down of the select gates, allowing electrons to escape from the channel. This plot may follow the plot of FIG. 14C. This situation may occur, e.g., at t11 in FIG. 11A-11H. At this time, the selected and unselected word lines all ramp down together from 8 V to 0 V, for instance, and the select gates are non-conductive, so that the channel portions 1401, 1402, 1403, 1404 and 1405 are capacitively coupled to −8 V. Since the trapped electrons are at a lower potential than the channel portions 1400 and 1406, the electrons can escape the channel by moving toward the source- or drain-end of the NAND string as indicated by the arrows.

FIG. 15A depicts a plot of Vch versus channel position, where memory cells in the erased state are between a selected memory cell and the driven end of a NAND string, allowing a voltage at the driven end to extend up to a channel portion of the selected memory cell, resulting in a large channel gradient. This plot is comparable to FIG. 14B but WLL2 instead WLL1 is the selected word line. As a result, the potential well in the channel is directly under WLL2. Moreover, FIG. 15A is meant to be compared to FIG. 15B, where the memory cell of WLL0 in FIG. 15A has a Vth of 0 V, denoting the erased state, and the memory cell of WLL0 in FIG. 15B has a Vth of 5 V, denoting the C state.

In FIG. 15A, the memory cells associated with WLL0 and WLL1 are in the erased state, so that the associated channel portions 1402 and 1403 are conductive and the source line voltage of 0 V, for instance, can reach these channel portions. Since the channel portion 1404 is at −7 V, there is a large gradient 1510 which generates electrons 1511e and holes 1511h, and read disturb can occur.

FIG. 15B depicts a plot of Vch versus channel position, where a memory cell in the C state is between a selected memory cell and the driven end of a NAND string, preventing a voltage at the driven end from extending up to a channel portion of the selected memory cell, and resulting in a smaller channel gradient compared to FIG. 15A. Since Vwl_unsel−Vth<0 V for the channel portion 1402, it becomes non-conductive and cuts off the channel portion 1403 from the source line. The channel portions 1402 and 1403 are similarly cut off from the bit line by the potential well under WLL2. A small amount of electron 1521e and hole 1521h generation may occur due to the gradient 1520, causing only a small amount of program disturb. This scenario demonstrates how the channel portion associated with a selected memory cell may or may not communicate with a driven voltage at an end of the NAND string. Typically, the likelihood of read disturb occurring for an adjacent cell is higher when the channel portion associated with a selected memory cell communicates with a driven voltage at an end of the NAND string. This situation occurs when the selected memory cell is at the edge of the NAND string (at WLL0 or WLL22) and the associated select gate is in a conductive state. It could also occur when the selected memory cell is separated from the edge of the NAND string by one or more other memory cells which are in the erased state or a relatively low state.

On the other hand, the presence of one or more memory cells in the C state or other relatively high state can advantageously isolate the channel portion associated with a selected memory cell from the end of the NAND string. For the case of four data states, and assuming the memory cells are randomly programmed to each of these states, the probability that a memory cell in the erased state is separated from the end of the NAND string by a memory cell in the C state is $1-0.75^n$, where n is the number of intermediate data memory cells between the selected memory cell and the end of the word line. For example, the probability is 0.25, 0.43, 0.58, 0.68 or 0.76 for n=1, 2, 3, 4 or 5 intermediate memory cells, respectively. In other words, the probability of serious read disturb is 0.75, 0.57, 0.42, 0.32 or 0.24 for n=1, 2, 3, 4 or 5 intermediate memory cells, respectively. Therefore, memory cells which are relatively further from the end of the NAND string are less likely to cause serious read disturb, in the scenario where the select gate at the end of the NAND string is conductive. Preventative measures to combat read disturb can therefore focus on memory cells which are relatively close to the end of the NAND string.

Another option is to provide the select gates in a non-conductive state when the word line voltages are ramped down. This can be acceptable a read operation but can result in trapped electrons, which can be a problem for a programming operation, as discussed.

FIG. 15C depicts a plot of Vch versus channel position before the word line voltages are ramped down in a sensing operation, where Vth=5 V and Vwl_sel=8 V for a memory cell connected to the selected word line, as a contrast to FIG. 14A in which Vwl_sel=3 V. Since the word line voltage is greater than the Vth for each transistor, each transistor is in a conductive state, so that the 0 V at the source line and bit line can travel throughout the channel. Essentially, the bottleneck which was formed by the non-conductive channel portion 1403 in FIG. 14A is removed by making the select gates conductive. This situation may occur such as at t10 in FIG. 12A-12H (3rd sensing operation), at t11 in FIG. 12A-12H (2nd sensing operation) or t10 in FIG. 13A-13H.

FIG. 15D follows FIG. 15C and depicts Vch versus channel position when voltages of a predefined subset of adjacent edge word lines are ramped down together according to the $2^{nd}$ sensing operation of FIG. 12A-12H. Additional channel portions are provided to show more detail. In particular, a channel portion 1419 is associated with WLL3-WLL20, channel portions 1421 and 1422 are associated with WLL21 and WLL22, respectively, and channel portion 1423 is associated with DWLD0/DWLD1. In this case, the sensing operation is set based on whether the selected word line is among a predefined subset of word lines which includes adjacent edge word lines at the source and/or drain-side of the NAND strings. The figure corresponds to time t12 in FIG. 12A-12H.

In this example, the predefined subset does not include word lines which are between the first set of adjacent word lines and the second set of adjacent word lines, e.g., WLL4-WLL18.

As mentioned, read disturb is most likely when reading a selected word line which is among a predefined subset of edge word lines. For example, the word lines in the subset at the source-side may be no more than 10-20% of all of the total number of word lines, and the word lines in the subset at the drain-side may be no more than 10-20% of all of the total number of word lines. For instance, with 23 word lines, there may be four word lines at the source-end (e.g., WLL0-WLL3 in FIG. 9D) and another four word lines at the drain-end (e.g., WLL19-WLL22 in FIG. 9D) which are in the predefined subset.

The word lines WLL0-WLL3 are adjacent to one another, and the word lines WLL19-WLL22 are adjacent to one another.

In this example, a worst case occurs when the memory cells of the edge word lines (e.g., WLL0 and WLL1) are in the C state, so that the word line voltage does not exceed the Vth. As a result, the channel portions 1402 and 1403 are non-conductive. With Vsl=0 V and the SGS transistor being conductive, a gradient from 0 V to −5 V is formed between DWLS1 and WLL0, and between WLL1 and WLL2. However, the read disturb will be minimal since the capacitance of the channel portion associated with the two edge word lines is small. The small capacitance results in a very short disturb time. Essentially, the potential well in the channel will be quickly filled by the holes which are generated by the channel gradients, so the time in which the electrons which are generated to cause read disturb is relatively small.

The read disturb is proportional to the amount of electrons generated, and the time period in which they are generated, and these are a function of the capacitance and depth of the potential well in the channel. A deeper well results in a sharper channel gradient, and thus more electron-hole generation, and a wider well results in a longer period of electron-hole generation since it takes longer to fill and equalize the potential of the channel. The read disturb is also proportional to the gate-to-channel electric field across a memory cell. A high gate voltage attracts more electrons into the charge-trapping region of a memory cell, causing more disturb. In this example, for the memory cell of WLL2 (the adjacent drain-side neighbor of the selected word line), the gate to channel voltage is 8−5=3 V and for the memory cell of WLL0 (the adjacent source-side neighbor of the selected word line), the gate to channel voltage is 0−5=−5 V. The read disturb of the memory cell of WLL0 will therefore be less than the memory cell of WLL2.

Lowering the gate voltage (Vpass) of the unselected memory cells could reduce read disturb, but this voltage should be sufficiently high to make the memory cells conductive during sensing of the selected memory cells.

FIG. 15E follows FIG. 15C, and is an alternative to FIG. 15D, where voltages of a predefined subset of non-adjacent edge word lines are ramped down together according to the $2^{nd}$ sensing operation of FIG. 12A-12H. Additional channel portions are provided to show more detail. In particular, a channel portion 1430 is associated with WLL3-WLL19, and channel portion 1431 is associated with WLL20.

The non-adjacent edge word lines can include, e.g., every other word line in a set of adjacent word lines which is adjacent to the source and/or drain-side of the plurality of word lines. For example, in this example, the non-adjacent edge word lines at the source-side include WLL0 and WLL2, and the set of adjacent word lines which is adjacent to the source-side of the plurality of word lines includes WLL0-WLL2. Also, the non-adjacent edge word lines at the drain-side include WLL20 and WLL22, and the set of adjacent word lines which is adjacent to the drain-side of the plurality of word lines includes WLL20-WLL22.

The predefined subset does not include word lines which are not among the predefined subset of adjacent word lines, e.g., WLL1, WLL3-WLL19 and WLL21.

Thus, the non-adjacent edge word lines can include the last data word line at the source and/or drain-side of a set of word line and one or more other word lines that are spaced apart by n>=2 word lines. In another example, the predefined subset could include three non-adjacent edge word lines at the source-side spaced apart by n=2 word lines, e.g., WLL0, WLL2 and WLL4. In another example, the predefined subset could include three non-adjacent edge word lines at the drain-side spaced apart by n=2 word lines, e.g., WLL18, WLL20 and WLL22. In another example, the predefined subset could include three non-adjacent edge word lines at the source-side spaced apart by n=3 word lines, e.g., WLL0, WLL3 and WLL6 and so forth.

This approach results in multiple potential wells in the channel. But, each well encompasses a shorter length of the channel and thus has a smaller capacitance compared to FIG. 15D, so that the wells can be quickly filled and reduce the amount of time for electron-hole generation.

Other implementations are possible as well. For example, the non-adjacent edge word lines can exclude the last data word line at the source and/or drain-side of a set of word line and include one or more other word lines that are spaced apart by n>=2 word lines, e.g., WLL1, WLL3 and WLL5 at the source-side. Also, the spacing between the word lines in the predefined subset can be unequal. For example, WLL0, WLL2 and WLL5 can be selected at the source-side. Another approach is to include both adjacent and non-adjacent word lines in the predefined subset, e.g., WLL0, WLL1 and WLL3 can be selected at the source-side and WL20-WL22 can be included at the drain-side. Other variations are possible as well.

In one embodiment, a method for sensing in a memory device comprises: 1) applying a demarcation voltage to a selected word line among a plurality of word lines in the memory device, wherein: the plurality of word lines are connected to memory cells in a plurality of NAND strings, the plurality of NAND strings comprise a selected NAND string and an unselected NAND string, the selected NAND string comprises a selected memory cell connected to the selected word line between a drain-side select gate and a source-side select gate, the unselected NAND string comprises an unselected memory cell connected to the selected word line between a drain-side select gate and a source-side select gate, a selected source-side select gate line, is connected to the source-side select gate of the selected NAND string, an unselected source-side select gate line, is connected to the source-side select gate of the unselected NAND string, a selected drain-side select gate line, is connected to the drain-side select gate of the selected NAND string, and an unselected drain-side select gate line, is connected to the drain-side select gate of the unselected NAND string; 2) while the demarcation voltage is applied to the selected word line, a read pass voltage which is higher than the demarcation voltage is applied to unselected word lines, WL_unsel, among the plurality of word lines, a respective turn-on voltage, Vsgs_sel_on, is applied to the selected source-side select gate line, and a respective turn-on voltage, Vsgd_sel_on, is applied to the selected drain-side select gate line, determining whether the selected memory cell is in a conductive state; 3) increasing a voltage of the selected word line from the demarcation voltage to an elevated level, the elevated level is within a +/−20% range of the read pass voltage; 4) concurrently ramping down word line voltages, the concurrently ramping down of the word line voltages comprises ramping down a voltage of the selected word line from the elevated level to a respective steady state voltage, Vwl_sel_ss, and ramping down a voltage of the unselected word lines from the read pass voltage to a respective steady state voltage, Vwl_unsel_ss, while a respective turn-off voltage, Vsgs_sel_off, is applied to the selected source-side select gate line; 5) ramping down a voltage of the selected source-side select gate line from the respective turn-on voltage, Vsgs_sel_on, to a respective turn-off voltage, Vsgs_sel_off, after the determining whether the selected memory cell is in the conductive state and before the concurrently ramping down of the word line voltages; and 6) ramping down a voltage of the selected drain-side select gate line from the respective turn-on voltage, Vsgd_sel_on, to a respective turn-off voltage, Vsgd_sel_off.

In another embodiment, a memory device comprises: a plurality of word lines connected to memory cells in a selected NAND string, wherein the plurality of word lines comprise a selected word line and unselected word lines, and the selected NAND string comprises a selected memory cell connected to the selected word line between a drain-side select gate and a source-side select gate; a selected source-side select gate line, connected to the source-side select gate of the selected NAND string; a selected drain-side select gate line, connected to the drain-side select gate of the selected NAND string; and a control circuit. The control circuit is configured to: apply a demarcation voltage to the selected word line, wherein the demarcation voltage is for distinguishing between data states in a read operation; while the demarcation voltage is applied to the selected word line and while a read pass voltage which is higher than the demarcation voltage is applied to unselected word lines, WL_unsel, among the plurality of word lines, and while a respective turn-on voltage, Vsgs_sel_on, is applied to the selected source-side select gate line, and a respective turn-on voltage, Vsgd_sel_on, is applied to the selected drain-side select gate line, make a determination of whether the selected memory cell is in a conductive state; increase a voltage of the selected word line from the demarcation voltage to an elevated level; to perform a word line ramp down, concurrently ramp down the voltage of the selected word line from the elevated level to a respective steady state voltage, Vwl_sel_ss, and ramp down the voltage of the unselected word lines from the read pass voltage to a respective steady state voltage, Vwl_unsel_ss; and after the determination of whether the selected memory cell is in the conductive state and before the word line ramp down, perform a select gate line ramp down, wherein the control circuit, to perform the select gate line ramp down, is configured to concurrently ramp down a voltage of the selected drain-side select gate line, from the respective turn-on voltage, Vsgd_sel_on, to a respective steady state voltage, Vsgd_sel_ss, and a voltage of the selected source-side select gate line, from the respective turn-on voltage, Vsgs_sel_on, to a respective turn-off voltage, Vsgs_sel_off.

In another embodiment, a method for sensing in a memory device comprises: 1) applying a demarcation voltage to a selected word line among a plurality of word lines in the memory device, wherein: the plurality of word lines are connected to memory cells in a plurality of NAND strings, the plurality of NAND strings comprise a selected NAND string and an unselected NAND string, the selected NAND string comprises a selected memory cell connected to the selected word line between a drain-side select gate and a source-side select gate, the unselected NAND string comprises an unselected memory cell connected to the selected word line between a drain-side select gate and a source-side select gate, a selected source-side select gate line, is connected to the source-side select gate of the selected NAND string, an unselected source-side select gate line, is connected to the source-side select gate of the unselected NAND string, a selected drain-side select gate line, is connected to the drain-side select gate of the selected NAND string, and an unselected drain-side select gate line, is connected to the drain-side select gate of the unselected NAND string; 2) while the demarcation voltage is applied to the selected word line and while a read pass voltage which is higher than the demarcation voltage is applied to unselected word lines, WL_unsel, among the plurality of word lines, and while a respective turn-on voltage, Vsgs_sel_on, is applied to the selected source-side select gate line, and a respective turn-on voltage, Vsgd_sel_on, is applied to the selected drain-side select gate line, determining whether the selected memory cell is in a conductive state, wherein the demarcation voltage is a verify voltage for determining whether the selected memory cell has reached a target data state in a programming operation; 3) increasing a voltage of the selected word line from the demarcation voltage to an elevated level; 4) concurrently ramping down word line voltages, the concurrently ramping down of the word line voltages comprises ramping down the voltage of the selected word line from the elevated level to a respective steady state voltage, Vwl_sel_ss, while ramping down the voltage of the unselected word lines from the read pass voltage to a respective steady state voltage, Vwl_unsel_ss; 5) ramping down a voltage of the selected source-side select gate line, from the respective turn-on voltage, Vsgs_sel_on, to a respective turn-off voltage, Vsgs_sel_off, after the determining whether the selected memory cell is in the conductive state and before the concurrently ramping down of the word line voltages; and 6) ramping down a voltage of the selected drain-side select gate line, from the respective turn-on voltage, Vsgd_sel_on, to a respective turn-off voltage, Vsgd_sel_off, after the concurrently ramping down of the word line voltages.

In another embodiment, a memory device comprises: a plurality of word lines connected to memory cells in a plurality of NAND strings, wherein the plurality of NAND strings comprise a selected NAND string and an unselected NAND string, the plurality of word lines comprise a selected word line and unselected word lines, the selected NAND string comprises a selected memory cell connected to the selected word line between a drain-side select gate and a source-side select gate, and the unselected NAND string comprises an unselected memory cell connected to the selected word line between a drain-side select gate and a source-side select gate; a selected source-side select gate line, connected to the source-side select gate of the selected NAND string; an unselected source-side select gate line, connected to the source-side select gate of the unselected NAND string; a selected drain-side select gate line, connected to the drain-side select gate of the selected NAND string; an unselected drain-side select gate line, connected to the drain-side select gate of the unselected NAND string; and a control circuit. The control circuit is configured to: apply a demarcation voltage to the selected word line; while the demarcation voltage is applied to the selected word line and while a read pass voltage which is higher than the demarcation voltage is applied to the unselected word lines, and while a respective turn-on voltage, Vsgs_sel_on, is applied to the selected source-side select gate line, and a respective turn-on voltage, Vsgd_sel_on, is applied to the selected drain-side select gate line, make a determination of whether the selected memory cell is in a conductive state; increase a voltage of the selected word line from the demarcation voltage to an elevated level, the elevated level is within a +/−20% range of the read pass voltage; perform a concurrent ramp down of word line voltages, wherein the control circuit, to perform the concurrent ramp down of word line voltages, concurrently ramps down the voltage of the selected word line from the elevated level to a respective steady state voltage, Vwl_sel_ss, and ramps down the voltage of the unselected word lines from the read pass voltage to a respective steady state voltage, Vwl_unsel_ss, while a respective turn-off voltage, Vsgs_sel_off, is applied to the selected source-side select gate line; ramp down a voltage of the selected source-side select gate line from the respective turn-on voltage, Vsgs_sel_on, to a respective turn-off voltage, Vsgs_sel_off, after the determination of whether the selected memory cell is in the conductive state and before the concurrent ramp down of the word line voltages; and ramp down a voltage of the selected drain-side select gate line from the respective turn-on voltage, Vsgd_sel_on, to a respective turn-off voltage, Vsgd_sel_off.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:
1. A method for sensing in a memory device, comprising:
applying a demarcation voltage to a selected word line among a plurality of word lines in the memory device, wherein:
the plurality of word lines are connected to memory cells in a plurality of NAND strings, the plurality of NAND strings comprise a selected NAND string and an unselected NAND string, the selected NAND string comprises a selected memory cell connected to the selected word line between a drain-side select gate and a source-side select gate, the unselected NAND string comprises an unselected memory cell connected to the selected word line between a drain-side select gate and a source-side select gate, a selected source-side select gate line, is connected to the source-side select gate of the selected NAND string, an unselected source-side select gate line, is connected to the source-side select gate of the unselected NAND string, a selected drain-side select gate line, is connected to the drain-side select gate of the selected NAND string, and an unselected drain-side select gate line, is connected to the drain-side select gate of the unselected NAND string;

while the demarcation voltage is applied to the selected word line, a read pass voltage which is higher than the demarcation voltage is applied to unselected word lines among the plurality of word lines, a respective turn-on voltage is applied to the selected source-side select gate line, and a respective turn-on voltage is applied to the selected drain-side select gate line, determining whether the selected memory cell is in a conductive state;

increasing a voltage of the selected word line from the demarcation voltage to an elevated level, the elevated level is within a +/−20% range of the read pass voltage;

concurrently ramping down word line voltages, the concurrently ramping down of the word line voltages comprises ramping down a voltage of the selected word line from the elevated level to a respective steady state voltage and ramping down a voltage of the unselected word lines from the read pass voltage to a respective steady state voltage, while a respective turn-off voltage is applied to the selected source-side select gate line;

ramping down a voltage of the selected source-side select gate line from the respective turn-on voltage to a respective turn-off voltage after the determining whether the selected memory cell is in the conductive state and before the concurrently ramping down of the word line voltages; and ramping down a voltage of the selected drain-side select gate line from the respective turn-on voltage to a respective turn-off voltage.

2. The method of claim 1, wherein:
the demarcation voltage is for distinguishing between data states in a read operation; and
the ramping down of the voltage of the selected drain-side select gate line occurs before the concurrently ramping down of the word line voltages.

3. The method of claim 2, further comprising:
the ramping down of the voltage of the selected drain-side select gate line and the voltage of the selected source-side select gate line, is concurrent, after the determining whether the selected memory cell is in the conductive state and before the concurrently ramping down of the word line voltages.

4. The method of claim 2, further comprising:
applying a respective turn-off voltage to the unselected drain-side select gate line and a respective turn-off voltage to the unselected source-side select gate line, while the demarcation voltage and the voltage at the elevated level are applied to the selected word line and during the concurrently ramping down of the word line voltages.

5. The method of claim 1, wherein:
the demarcation voltage is a verify voltage for determining whether the selected memory cell has reached a target data state in a programming operation;
the ramping down of the voltage of the selected drain-side select gate line occurs before the concurrently ramping down of the word line voltages when the selected word line is among a subset of the plurality of word lines, and after the concurrently ramping down of the word line voltages when the selected word line is not among the subset of the plurality of word lines;
the subset of the plurality of word lines comprises source-side and middle word lines but not drain-side word lines among the plurality of word lines; and
the drain-side word lines are adjacent to a drain-side of the selected NAND string and the unselected NAND string and comprises no more than 20% of the plurality of word line.

6. The method of claim 1, wherein:
the demarcation voltage is a verify voltage for determining whether the selected memory cell has reached a target data state in a programming operation; and
the ramping down of the voltage of the selected drain-side select gate line occurs after the concurrently ramping down of the word line voltages.

7. The method of claim 6, further comprising:
applying a program voltage to the selected word line in connection with the programming operation after the concurrently ramping down word line voltages; and
during the applying of the program voltage, boosting a channel of the selected NAND string.

8. The method of claim 6, wherein:
the respective turn-on voltage is applied to the selected drain-side select gate line, while the voltage at the elevated level is applied to the selected word line and during the concurrently ramping down of the word line voltages.

9. The method of claim 6, further comprising:
for the unselected drain-side select gate line, applying a respective turn-off voltage while the demarcation voltage is applied to the selected word line and applying a respective turn-on voltage while the voltage at the elevated level is applied to the selected word line and during the concurrently ramping down of the word line voltages; and
ramping down a voltage of the unselected drain-side select gate line, from the respective turn-on voltage to the respective turn-off voltage after the ramping down of the voltage of the selected word line and the voltages of the unselected word lines.

10. The method of claim 6, further comprising:
for the unselected source-side select gate line, applying a respective turn-off voltage while the demarcation voltage and the voltage at the elevated level are applied to the selected word line and during the concurrently ramping down of the word line voltages.

11. The method of claim 1, wherein:
the selected NAND string comprises a floating body channel; and
the plurality of word lines comprise a plurality of word line layers above one another in a stack, and separated from one another by dielectric layers.

12. A memory device, comprising:
a plurality of word lines connected to memory cells in a selected NAND string, wherein the plurality of word lines comprise a selected word line and unselected word lines, and the selected NAND string comprises a selected memory cell connected to the selected word line between a drain-side select gate and a source-side select gate;

a selected source-side select gate line, connected to the source-side select gate of the selected NAND string;

a selected drain-side select gate line, connected to the drain-side select gate of the selected NAND string; and a control circuit, the control circuit is configured to:
  apply a demarcation voltage to the selected word line, wherein the demarcation voltage is for distinguishing between data states in a read operation;
  while the demarcation voltage is applied to the selected word line and while a read pass voltage which is higher than the demarcation voltage is applied to unselected word lines among the plurality of word lines, and while a respective turn-on voltage is applied to the selected source-side select gate line, and a respective turn-on voltage is applied to the selected drain-side select gate line, make a determination of whether the selected memory cell is in a conductive state;
  increase a voltage of the selected word line from the demarcation voltage to an elevated level;
  to perform a word line ramp down, concurrently ramp down the voltage of the selected word line from the elevated level to a respective steady state voltage and ramp down the voltage of the unselected word lines from the read pass voltage to a respective steady state voltage; and
  after the determination of whether the selected memory cell is in the conductive state and before the word line ramp down, perform a select gate line ramp down, wherein the control circuit, to perform the select gate line ramp down, is configured to concurrently ramp down a voltage of the selected drain-side select gate line, from the respective turn-on voltage to a respective steady state voltage and a voltage of the selected source-side select gate line, from the respective turn-on voltage to a respective turn-off voltage.

13. The memory device of claim 12, further comprising:
an unselected NAND string comprising an unselected memory cell connected to the selected word line between a drain-side select gate and a source-side select gate;
an unselected source-side select gate line, connected to the source-side select gate of the unselected NAND string; and
an unselected drain-side select gate line, connected to the drain-side select gate of the unselected NAND string, wherein the control circuit is configured to apply a respective turn-off voltage to the unselected drain-side select gate line, and a respective turn-off voltage to the unselected source-side select gate line, while the demarcation voltage and the voltage at the elevated level are applied to the selected word line and during the word line ramp down and the select gate line ramp down.

14. The memory device of claim 12, wherein:
the selected NAND string comprises a floating body channel; and
the plurality of word lines comprise a plurality of word line layers above one another in a stack, and separated from one another by dielectric layers.

15. The memory device of claim 12, wherein:
the respective steady state voltage the respective steady state voltage the respective turn-off voltage and the respective turn-off voltage are 0 V.

16. The memory device of claim 12, wherein:
the elevated level is within a +/−20% range of the read pass voltage.

17. A method for sensing in a memory device, comprising:
applying a demarcation voltage to a selected word line among a plurality of word lines in the memory device, wherein:
  the plurality of word lines are connected to memory cells in a plurality of NAND strings,
  the plurality of NAND strings comprise a selected NAND string and an unselected NAND string,
  the selected NAND string comprises a selected memory cell connected to the selected word line between a drain-side select gate and a source-side select gate,
  the unselected NAND string comprises an unselected memory cell connected to the selected word line between a drain-side select gate and a source-side select gate,
  a selected source-side select gate line, is connected to the source-side select gate of the selected NAND string,
  an unselected source-side select gate line, is connected to the source-side select gate of the unselected NAND string,
  a selected drain-side select gate line, is connected to the drain-side select gate of the selected NAND string, and
  an unselected drain-side select gate line, is connected to the drain-side select gate of the unselected NAND string;
while the demarcation voltage is applied to the selected word line and while a read pass voltage which is higher than the demarcation voltage is applied to unselected word lines among the plurality of word lines, and while a respective turn-on voltage is applied to the selected source-side select gate line, and a respective turn-on voltage is applied to the selected drain-side select gate line, determining whether the selected memory cell is in a conductive state, wherein the demarcation voltage is a verify voltage for determining whether the selected memory cell has reached a target data state in a programming operation;
increasing a voltage of the selected word line from the demarcation voltage to an elevated level;
concurrently ramping down word line voltages, the concurrently ramping down of the word line voltages comprises ramping down the voltage of the selected word line from the elevated level to a respective steady state voltage while ramping down the voltage of the unselected word lines from the read pass voltage to a respective steady state voltage;
ramping down a voltage of the selected source-side select gate line, from the respective turn-on voltage to a respective turn-off voltage after the determining whether the selected memory cell is in the conductive state and before the concurrently ramping down of the word line voltages; and
ramping down a voltage of the selected drain-side select gate line, from the respective turn-on voltage to a respective turn-off voltage after the concurrently ramping down of the word line voltages.

18. The method of claim 17, wherein:
the respective turn-on voltage is applied to the selected drain-side select gate line, while the demarcation voltage and the voltage at the elevated level are applied to the selected word line and during the concurrently ramping down of the word line voltages.

19. The method of claim 17, wherein:
a respective turn-off voltage is applied to the unselected drain-side select gate line, while the demarcation voltage is applied to the selected word line;
a respective turn-on voltage is applied to the unselected drain-side select gate line, while the voltage at the elevated level is applied to the selected word line and during the concurrently ramping down of the word line voltages; and
the method further comprises ramping down a voltage of the unselected drain-side select gate line, from the respective turn-on voltage to the respective turn-off voltage concurrent with the ramping down of the voltage of the selected drain-side select gate line.

20. The method of claim 17, further comprising:
for the unselected source-side select gate line, applying a respective turn-off voltage while the demarcation voltage is applied to the selected word line and during the concurrently ramping down of the word line voltages.

21. The method of claim 17, wherein:
the elevated level is within a +/−20% range of the read pass voltage.

* * * * *